(12) United States Patent
Lundstrum et al.

(10) Patent No.: US 9,257,980 B2
(45) Date of Patent: Feb. 9, 2016

(54) MEASURING CAPACITANCE OF A CAPACITIVE SENSOR WITH A MICROCONTROLLER HAVING DIGITAL OUTPUTS FOR DRIVING A GUARD RING

(71) Applicant: Microchip Technology Incorporated, Chandler, AZ (US)

(72) Inventors: Zeke Lundstrum, Chandler, AZ (US); Keith Curtis, Gilbert, AZ (US); Burke Davison, Chandler, AZ (US); Sean Steedman, Phoenix, AZ (US); Yann LeFaou, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 627 days.

(21) Appl. No.: 13/633,523

(22) Filed: Oct. 2, 2012

(65) Prior Publication Data

US 2013/0088372 A1    Apr. 11, 2013

Related U.S. Application Data

(60) Provisional application No. 61/544,150, filed on Oct. 6, 2011.

(51) Int. Cl.
*G06F 3/041* (2006.01)
*H03K 17/96* (2006.01)

(52) U.S. Cl.
CPC ............. *H03K 17/9622* (2013.01); *H03K 2217/960725* (2013.01); *H03K 2217/960765* (2013.01)

(58) Field of Classification Search
CPC ............................................ G06F 3/041

USPC ......................................... 345/173
See application file for complete search history.

(56) References Cited

U.S. PATENT DOCUMENTS

| 3,295,121 A | 12/1966 | Scheel ................... 340/629 |
| 3,832,678 A | 8/1974 | Gysell et al. ............ 340/587 |
| 4,213,047 A | 7/1980 | Mccord .................. 250/381 |
| 4,222,045 A | 9/1980 | Cholin ................... 340/628 |

(Continued)

FOREIGN PATENT DOCUMENTS

| CN | 1087739 A | 6/1994 | ............ G08B 17/11 |
| CN | 101261225 A | 9/2008 | ............ G01N 21/53 |

(Continued)

OTHER PUBLICATIONS

Bohn, Bruce, "AN1250: Microchip CTMU for Capacitive Touch Applications," Microchip Technology, Inc., XP055007432, URL: http://www.microchip.com/stellent/idcplg?IdcService=SS_GET_PAGE&nodeID=1824&appnote=en539441, 22 pages, Feb. 3, 2009.

(Continued)

*Primary Examiner* — Fred Tzeng
(74) *Attorney, Agent, or Firm* — Slayden Grubert Beard PLLC

(57) ABSTRACT

A guard ring is provided around each capacitive sensor plate and charged to substantially the same voltage as a voltage on the capacitive sensor plate. The guard ring reduces parasitic capacitances of the capacitive sensor plate caused by differences in voltage potentials between the capacitive sensor plate, and adjacent circuit conductors, ground planes and power planes. Two digital outputs and associated voltage divider resistors are used to drive the guard ring voltage to substantially the same voltage as the voltage on the capacitive sensor plate.

29 Claims, 14 Drawing Sheets

(56) References Cited

U.S. PATENT DOCUMENTS

| | | | |
|---|---|---|---|
| 4,260,984 A | 4/1981 | Honma | 340/630 |
| 4,266,220 A | 5/1981 | Malinowski | 340/360 |
| 4,401,978 A | 8/1983 | Solomon | 340/628 |
| 4,538,137 A | 8/1985 | Kimura | 340/512 |
| 4,652,866 A | 3/1987 | Siegmann et al. | 340/628 |
| 4,672,324 A | 6/1987 | Van Kampen | 307/653 |
| 5,173,683 A | 12/1992 | Brighenti et al. | 340/505 |
| 5,243,330 A | 9/1993 | Thuillard | 340/629 |
| 5,422,807 A | 6/1995 | Mitra et al. | 700/79 |
| 5,633,591 A | 5/1997 | Childress et al. | 324/399 |
| 5,705,988 A | 1/1998 | Mcmaster | 340/628 |
| 5,966,078 A | 10/1999 | Tanguay | 340/636.1 |
| 6,257,049 B1 | 7/2001 | Greybush | 73/29.01 |
| 6,433,712 B1 | 8/2002 | Ohnhaeuser et al. | 341/118 |
| 6,661,346 B1 | 12/2003 | Wood et al. | 340/601 |
| 6,981,090 B1 | 12/2005 | Kutz et al. | 710/317 |
| 7,288,946 B2 | 10/2007 | Hargreaves et al. | 324/674 |
| 7,307,485 B1 | 12/2007 | Snyder et al. | 331/150 |
| 7,382,140 B2 | 6/2008 | Obrecht | 324/678 |
| 7,460,441 B2 | 12/2008 | Bartling | 368/118 |
| 7,764,213 B2 | 7/2010 | Bartling et al. | 341/152 |
| 7,834,773 B2 | 11/2010 | Kato | 340/630 |
| 8,031,094 B2 | 10/2011 | Hotelling et al. | 341/143 |
| 8,487,655 B1* | 7/2013 | Kutz et al. | 326/86 |
| 8,510,068 B2 | 8/2013 | Kawashima | 702/87 |
| 8,547,135 B1* | 10/2013 | Yarlagadda et al. | 326/38 |
| 8,847,802 B2 | 9/2014 | Lundstrum et al. | 341/141 |
| 8,884,771 B2 | 11/2014 | Cooke et al. | 340/628 |
| 8,981,754 B1 | 3/2015 | Rohilla et al. | 323/312 |
| 9,035,243 B2 | 5/2015 | Lenkeit et al. | 250/287 |
| 2002/0078744 A1 | 6/2002 | Gehman et al. | 73/204.11 |
| 2002/0101345 A1 | 8/2002 | Pattok et al. | 340/516 |
| 2002/0153923 A1 | 10/2002 | Piasecki et al. | 326/57 |
| 2003/0058114 A1 | 3/2003 | Miller et al. | 340/577 |
| 2004/0257235 A1 | 12/2004 | Right et al. | 340/628 |
| 2005/0030172 A1 | 2/2005 | Right et al. | 340/521 |
| 2007/0075710 A1 | 4/2007 | Hargreaves et al. | 324/658 |
| 2008/0012715 A1 | 1/2008 | Montgomery | 340/579 |
| 2008/0079148 A1* | 4/2008 | Leung et al. | 257/734 |
| 2008/0111714 A1 | 5/2008 | Kremin | 341/33 |
| 2008/0272826 A1 | 11/2008 | Smit et al. | 327/509 |
| 2008/0312857 A1 | 12/2008 | Sequine | 702/65 |
| 2009/0230305 A1 | 9/2009 | Burke et al. | 250/336.1 |
| 2009/0256817 A1 | 10/2009 | Perlin et al. | 345/174 |
| 2010/0059295 A1 | 3/2010 | Hotelling et al. | 178/18.06 |
| 2010/0060593 A1 | 3/2010 | Krah | 345/173 |
| 2010/0097015 A1* | 4/2010 | Knoedgen et al. | 318/135 |
| 2010/0102832 A1 | 4/2010 | Bartling et al. | 324/679 |
| 2010/0181180 A1 | 7/2010 | Peter | 200/5 R |
| 2010/0231241 A1 | 9/2010 | Mueck et al. | 324/686 |
| 2010/0283760 A1 | 11/2010 | Leung et al. | 345/174 |
| 2010/0287571 A1 | 11/2010 | Mohammed et al. | 719/328 |
| 2010/0295555 A1 | 11/2010 | Emanuel et al. | 324/601 |
| 2011/0007028 A1 | 1/2011 | Curtis et al. | 345/174 |
| 2011/0234417 A1 | 9/2011 | Aleman et al. | 340/660 |
| 2011/0267287 A1 | 11/2011 | Bartling et al. | 345/173 |
| 2011/0267309 A1 | 11/2011 | Hanauer et al. | 345/174 |
| 2012/0005693 A1 | 1/2012 | Mohammed et al. | 719/328 |
| 2012/0098676 A1 | 4/2012 | Wang | 341/118 |
| 2012/0112728 A1 | 5/2012 | Bodo et al. | 323/311 |
| 2013/0088246 A1* | 4/2013 | Lundstrum et al. | 324/686 |
| 2013/0090873 A1* | 4/2013 | Lundstrum et al. | 702/64 |
| 2013/0126715 A1 | 5/2013 | Flaherty | 250/214 R |
| 2013/0298100 A1 | 11/2013 | Hastings et al. | 716/126 |
| 2013/0322439 A1* | 12/2013 | Verhallen et al. | 370/389 |

FOREIGN PATENT DOCUMENTS

| | | | | |
|---|---|---|---|---|
| CN | 102063774 A | 5/2011 | | G08B 17/10 |
| CN | 102096978 A | 6/2011 | | G08B 17/107 |
| CN | 102257543 A | 11/2011 | | G08B 11/00 |
| DE | 10357371 A1 | 7/2005 | | G08B 17/00 |
| DE | 102009030495 A1 | 1/2011 | | G01B 7/00 |
| EP | 1719947 A1 | 11/2006 | | F23N 5/12 |
| FR | 2473201 A1 | 7/1981 | | G08B 17/11 |
| GB | 1598821 A | 9/1981 | | G08B 17/11 |
| GB | 2117560 A | 10/1983 | | G01N 27/64 |
| GB | 2156126 A | 10/1985 | | G08B 17/00 |
| WO | 2006/138205 A1 | 12/2006 | | H03M 1/06 |

OTHER PUBLICATIONS

Perme, Thomas et al., AN1298: Capacitive Touch Using Only an ADC ("CVD"), Microchip Technology, Inc., XP055007357, URL: http://www.microchip.com/stellent/idcplg?IdcService=SS_GET_PAGE&nodeId=1824&appnote=en545264, 4 pages, Oct. 7, 2009.
Davison, Burke, "AN1334: Techniques for Robust Touch Sensing Design," Microchip Technology, Inc., XP055047201, URL: http://www.microchip.com/downloads/en/AppNotes/01334A.pdf, 28 pages, Aug. 6, 2010.
Yedamale, Padmaraja et al., "AN1375: See What You Can Do with the CTMU," Microchip Technology, Inc., XP055047211, URL: http://www.microchip.com/downloads/en/AppNotes/CTMU%2001375a.pdf, 12 pages, May 11, 2011.
International Search Report and Written Opinion, Application No. PCT/US2012/058682, 12 pages, Dec. 17, 2012.
International Search Report and Written Opinion, Application No. PCT/US2012/058691, 13 pages, Dec. 19, 2012.
International Search Report and Written Opinion, Application No. PCT/US2013/052956, 12 pages, Jan. 28, 2014.
International Search Report and Written Opinion, Application No. PCT/US2012/058832, 11 pages, Jan. 22, 2013.
International Search Report and Written Opinion, Application No. PCT/US2012/058837, 14 pages, Feb. 18, 2013.
Yair, R., "Charge Sampling Method for Low Current Measurement," Review of Scientific Instruments, vol. 45, No. 3, 6 pages, Mar. 1974.
Margarita, Andrey, "Application Note AN2245: Smart Smoke Detector," Cypress Semiconductor Corporation, XP055054690, URL: http://www.psocdeveloper.com/uploads/tx_piapappnote/an2245_01.pdf, 12 pages, Feb. 22, 2005.
Perme, Thomas, "AN1101: Introduction to Capacitive Sensing," Microchip Technology, Inc., XP002693941, URL: http://ww1.microchip.com/downloads/en/AppNotes/01101A.pdf, 10 pages, Jun. 25, 2007.
Anonymous, "Delta-Sigma Modulation," Wikipedia, URL: http://en.wikipedia.org/w/index.php?title=Special:Book&bookcmd=download&collection_id=fa136df1282a073a&writer=rl&return_to=Delta-sigma modulation, 14 pages, 2012.
International Search Report and Written Opinion, Application No. PCT/US2012/058716, 10 pages, Mar. 15, 2013.
International Search Report and Written Opinion, Application No. PCT/US2012/069086, 10 pages, Apr. 5, 2013.
International Search Report and Written Opinion, Application No. PCT/US2012/069094, 12 pages, Apr. 5, 2013.
international Search Report and Written Opinion, Application No. PCT/US2012/058688, 11 pages, Apr. 5, 2013.
International Search Report and Written Opinion, Application No. PCT/US2012/069076, 11 pages, Apr. 10, 2013.
International Search Report and Written Opinion, Application No. PCT/US2012/070466, 13 pages, Apr. 24, 2013.
U.S. Advisory Action, U.S. Appl. No. 13/709,399, 3 pages, Sep. 8, 2015.
Cuilan, Tan, Research & Design of Wireless Smoke Detection System, Engineering Science and technology II, China Master's Theses (Chinese language), 1 page (English abstract), Sep. 15, 2009.
Chinese Office Action, Application No. 201280068100.7, 5 pages, Oct. 9, 2015.
Chinese Office Action, Application No. 201280067196.5, 13 pages, Oct. 28, 2015.
RE46C162/163: "CMOS Ionization Smoke Detector ASIC with Interconnect, Timer Mode and Alarm Memory," Microchip Technology Incorporated, 22 pages, © 2010.
U.S. Non-Final Office Action, U.S. Appl. No. 13/709,399, 39 pages, Dec. 2, 2015.

* cited by examiner

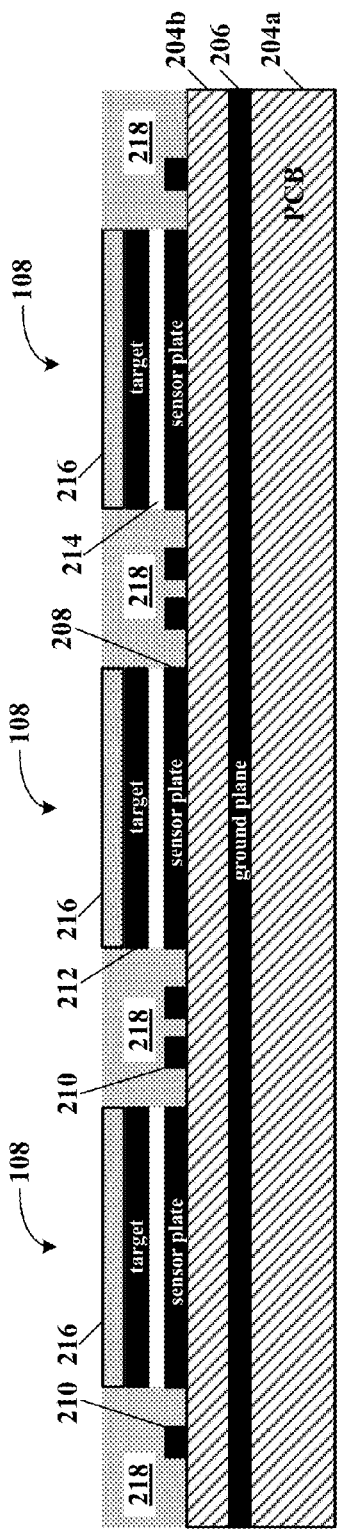
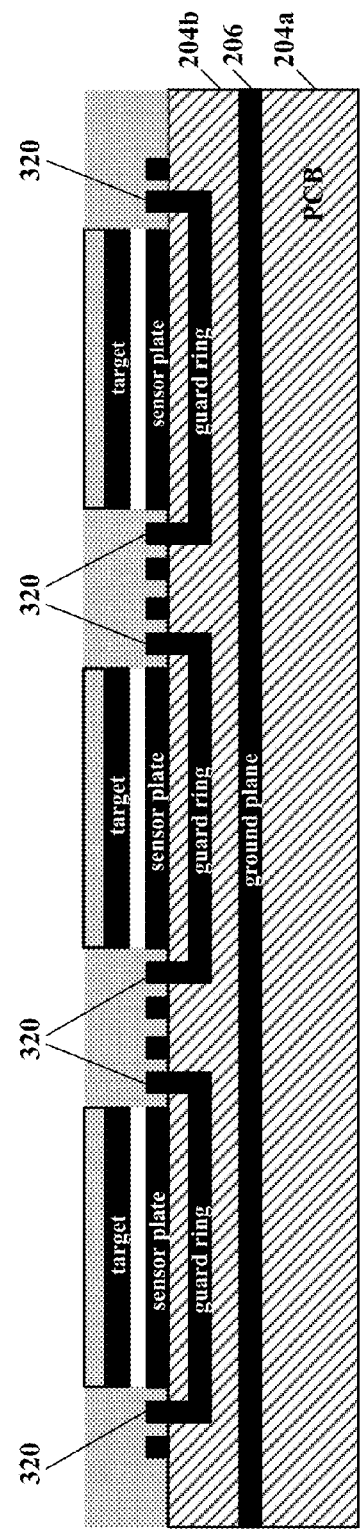
Figure 2
Figure 3

MEASURING CAPACITANCE OF A CAPACITIVE SENSOR WITH A MICROCONTROLLER HAVING DIGITAL OUTPUTS FOR DRIVING A GUARD RING

RELATED PATENT APPLICATION

This application claims priority to commonly owned U.S. Provisional Patent Application Ser. No. 61/544,150; filed Oct. 6, 2011; entitled "Microcontroller ADC with Guard Ring Drive Outputs," by Zeke Lundstrum, Keith Curtis, Burke Davison, Sean Steedman and Yann LeFaou; which is hereby incorporated by reference herein for all purposes.

TECHNICAL FIELD

The present disclosure relates to analog-to-digital converters in particular for use in a microcontroller and, more particularly, for use by a microcontroller with capacitive touch detection capabilities.

BACKGROUND

Touching of a capacitive sensor or approaching a capacitive proximity sensor by an object, e.g., a piece of metal, a finger, a hand, a foot, a leg, etc., changes certain parameters thereof, in particular the capacitance value of a capacitor that is built into the touch sensor used, for example, in human to machine interface devices, e.g., keypad or keyboard. Microcontrollers now include peripherals that enhance the detection and evaluation of such capacitive sensors. One such application utilizes capacitive voltage division (CVD) to evaluate whether a capacitive touch element has been touched or not. However, when such sensors are operated in high noise environments, the resolution or detection in conventional systems may not suffice.

In particular parasitic capacitance may pose a problem in many capacitive sensor applications. Parasitic capacitance is generated whenever a conductor adjacent to the sensor (or its connection to the microcontroller) is at a different voltage potential then the sensor. Therefore it is preferable to reduce the parasitic capacitance associated with capacitive sensors, assuming that parasitic capacitance may decrease the sensitivity of a capacitive sensor and thereby decrease the resolution of the resulting capacitive conversion process, e.g., CVD (capacitive voltage division).

SUMMARY

Therefore what is needed is an effective way to reduce parasitic capacitance associated with a capacitive sensor, thereby increasing its capacitive measurement change sensitivity during operation thereof.

According to an embodiment, a microcontroller may comprise: a digital processor with memory; a plurality of external input/output nodes that can be programmed to function as analog nodes, a multiplexer controlled by the digital processor for selecting one of said analog nodes and coupling the analog node to an analog bus; an analog-to-digital converter (ADC) coupled with the analog bus for converting an analog voltage on the analog bus to a digital representation thereof and having a digital output coupled to the digital processor for conveying the digital representation; and an external node coupled to the analog bus.

According to a further embodiment, a switch may be coupled between the external node and the analog bus, wherein the switch may be programmably controlled by the digital processor. According to a further embodiment, at least two digital output nodes of the microcontroller may be coupled to respective ones of a plurality of digital output drivers.

According to another embodiment, a microcontroller may comprise: a digital processor with memory; a plurality of digital output drivers controlled by the digital processor; a sample and hold capacitor; an analog-to-digital converter (ADC) having a digital output coupled to the digital processor; at least two digital output nodes of the microcontroller coupled to respective ones of the plurality of digital output drivers; a first analog node coupled to a first analog bus in the microcontroller; the first analog bus may be switchably coupled to a power supply common, a power supply voltage, the sample and hold capacitor, or a second analog bus; the second analog bus may be switchably coupled to the power supply common, the power supply voltage, the sample and hold capacitor, or the first analog bus; and the sample and hold capacitor may be switchably coupled to either the first analog bus or an input of the ADC. According to a further embodiment, the first analog node may be coupled to the second analog bus and may be adapted for coupling to a capacitive sensor. According to a further embodiment, the at least two digital output nodes may be adapted for coupling to a resistor voltage divider network that drives a voltage onto a guard ring associated with the capacitive sensor. According to a further embodiment, a second analog node may be coupled to the second analog bus and adapted for coupling to an external capacitor. According to a further embodiment, at least one internal capacitor may be switchably coupled to the second analog bus.

According to a further embodiment, the microcontroller may comprise a plurality of switches, wherein: a first one of the plurality of switches couples the first and second analog buses together when closed, a second one of the plurality of switches couples the first analog bus to a power supply common when closed, a third one of the plurality of switches couples the second analog bus to a power supply voltage when closed, a fourth one of the plurality of switches couples the first analog bus to the power supply voltage when closed, and a fifth one of the plurality of switches couples the second analog bus to the power supply common when closed.

According to a further embodiment, the digital processor controls the plurality of switches. According to a further embodiment, the plurality of switches may be a plurality of field effect transistor (FET) switches. According to a further embodiment, the plurality of digital output drivers may have logic high outputs at substantially the power supply voltage, and logic low outputs at substantially the power supply common.

According to yet another embodiment, a capacitive sensor system may comprise: a capacitive sensor; a guard ring associated with the capacitive sensor; a first resistor coupled to the guard ring; a second resistor coupled to the guard ring; and a microcontroller, may comprise: a digital processor with memory; a plurality of digital output drivers controlled by the digital processor; a sample and hold capacitor; an analog-to-digital converter (ADC) having a digital output coupled to the digital processor; at least two digital output nodes of the microcontroller coupled to respective ones of the plurality of digital output drivers, wherein one of the at least two digital output nodes may be coupled to the first resistor and the other one of the at least two digital output nodes may be coupled to the second resistor; a first analog node may be coupled to a first analog bus in the microcontroller and the capacitive sensor; the first analog bus may be switchably coupled to a power supply common, a power supply voltage, the sample and hold capacitor, or a second analog bus; the second analog bus may be switchably coupled to the power supply common, the power supply voltage, the sample and hold capacitor, or the first analog bus; and the sample and hold capacitor may be switchably coupled to either the first analog bus or an input of the ADC.

According to a further embodiment, a second analog node may be coupled to the second analog bus and adapted for coupling to an external capacitor. According to a further embodiment, at least one internal capacitor may be switchably coupled to the second analog bus.

According to a further embodiment, the capacitive sensor system may comprise a plurality of switches, wherein: a first one of the plurality of switches couples the first and second analog buses together when closed, a second one of the plurality of switches couples the first analog bus to a power supply common when closed, a third one of the plurality of switches couples the second analog bus to a power supply voltage when closed, a fourth one of the plurality of switches couples the first analog bus to the power supply voltage when closed, and a fifth one of the plurality of switches couples the second analog bus to the power supply common when closed. According to a further embodiment, the first resistor may be twice the resistance of the second resistor. According to a further embodiment, a combined capacitive value of the external capacitor and the sample and hold capacitor may be approximately one-half the capacitive value of the capacitive sensor. According to a further embodiment, a voltage on the guard ring may be substantially the same as a voltage on the capacitive sensor. According to a further embodiment, the digital processor may control the plurality of switches.

According to yet another embodiment, a method for measuring capacitance of a capacitive sensor and controlling a voltage on a guard ring associated with the capacitive sensor may comprise the steps of: providing a capacitive sensor; providing a guard ring associated with the capacitive sensor; providing a first resistor coupled to the guard ring; providing a second resistor coupled to the guard ring; and providing a microcontroller, comprising: a digital processor with memory; a plurality of digital output drivers controlled by the digital processor; a sample and hold capacitor; an analog-to-digital converter (ADC) having a digital output coupled to the digital processor; at least two digital output nodes of the microcontroller coupled to respective ones of the plurality of digital output drivers, wherein one of the at least two digital output nodes may be coupled to the first resistor and the other one of the at least two digital output nodes may be coupled to the second resistor; a first analog node may be coupled to a first analog bus in the microcontroller and the capacitive sensor; the first analog bus may be switchably coupled to a power supply common, a power supply voltage, the sample and hold capacitor, or a second analog bus; the second analog bus may be switchably coupled to the power supply common, the power supply voltage, the sample and hold capacitor, or the first analog bus; and the sample and hold capacitor may be switchably coupled to either the first analog bus or an input of the ADC; and performing the steps of: coupling the sample and hold capacitor to the first analog bus; coupling the first analog bus to a power supply voltage; coupling the second analog bus to a power supply common; driving respective ones of the at least two digital output nodes to substantially the power supply common with outputs from the first and second output drivers; driving a one of the at least two digital output nodes to substantially the power supply voltage; driving an other one of the at least two digital output nodes to substantially the power supply common; coupling the first and second analog buses together long enough for a first charge to settle therebetween; decoupling the sample and hold capacitor from the first analog bus; coupling the second analog bus to the power supply common; coupling the second analog bus to the power supply voltage; driving the third and fourth analog buses to substantially the power supply voltage; converting the settled first charge on the sample and hold capacitor to a first digital representation thereof with the ADC; reading the first digital representation from the ADC with the digital processor; coupling the first analog bus to the power supply common; driving the one of the at least two digital output nodes to substantially the power supply common; driving the other one of the at least two digital output nodes to substantially the power supply voltage; coupling the first and second analog buses together long enough for a second charge to settle therebetween; decoupling the sample and hold capacitor from the first analog bus; coupling the second analog bus to the power supply voltage; coupling the second analog bus to the power supply common; driving the third and fourth analog buses to substantially the power supply common; converting the settled second charge on the sample and hold capacitor to a second digital representation thereof with the ADC; and reading the second digital representation from the ADC with the digital processor.

According to a further embodiment of the method, the step of processing the first and the second digital representations is done with the digital processor to substantially reduce common mode noise. According to a further embodiment of the method, may comprise the steps of: storing the first and the second digital representations in a memory associated with the digital processor; comparing the stored first and second digital representations with subsequent first and second digital representations, wherein if the stored first and second digital representations are substantially the same as the subsequent first and second digital representations then the capacitive sensor may be not actuated, and if the stored first and second digital representations are not substantially the same as the subsequent first and second digital representations then the capacitive sensor may be actuated.

According to still another embodiment, a method for measuring capacitance of a capacitive sensor and controlling a voltage on a guard ring associated with the capacitive sensor may comprise the steps of: a) charging a sample and hold capacitor to a first voltage; b) charging a capacitive sensor to a second voltage; c) charging a guard ring associated with the capacitive sensor to the second voltage; d) charging the guard ring to a third voltage; e) coupling together the sample and hold capacitor and the capacitive sensor long enough for a first charge to settle therebetween; f) decoupling the sample and hold capacitor from the capacitive sensor; g) converting the settled first charge on the sample and hold capacitor to a first digital representation thereof with an analog-to-digital converter (ADC); h) charging the capacitive sensor to the second voltage; i) charging the capacitive sensor to the first voltage; j) charging the guard ring to the first voltage; k) reading the first digital representation of the first charge from the ADC with a digital processor; l) charging the guard ring to a fourth voltage; m) coupling together the sample and hold capacitor and the capacitive sensor long enough for a second charge to settle therebetween; n) decoupling the sample and hold capacitor from the capacitive sensor; o) converting the settled second charge on the sample and hold capacitor to a second digital representation thereof with the analog-to-digital converter (ADC); p) charging the capacitive sensor to the first voltage; q) charging the capacitive sensor to the second voltage; r) charging the guard ring to the second voltage; s)

reading the second digital representation of the second charge from the ADC with the digital processor; and t) returning to step d).

According to a further embodiment of the method, the first voltage may be approximately a power supply voltage and the second voltage may be approximately a power supply common. According to a further embodiment of the method, the first voltage may be approximately a power supply common and the second voltage may be approximately a power supply voltage. According to a further embodiment of the method, a voltage on the guard ring may be substantially the same as a voltage on the capacitive sensor.

BRIEF DESCRIPTION OF THE DRAWINGS

A more complete understanding of the present disclosure may be acquired by referring to the following description taken in conjunction with the accompanying drawings wherein:

FIG. 2 illustrates a schematic elevational view of capacitive sensor keys shown in FIG. 1;

FIG. 3 illustrates a schematic elevational view of capacitive sensor keys shown in FIG. 1 and having capacitive guard rings around each of the capacitive sensors, according to a specific example embodiment of this disclosure;

Figure 1:
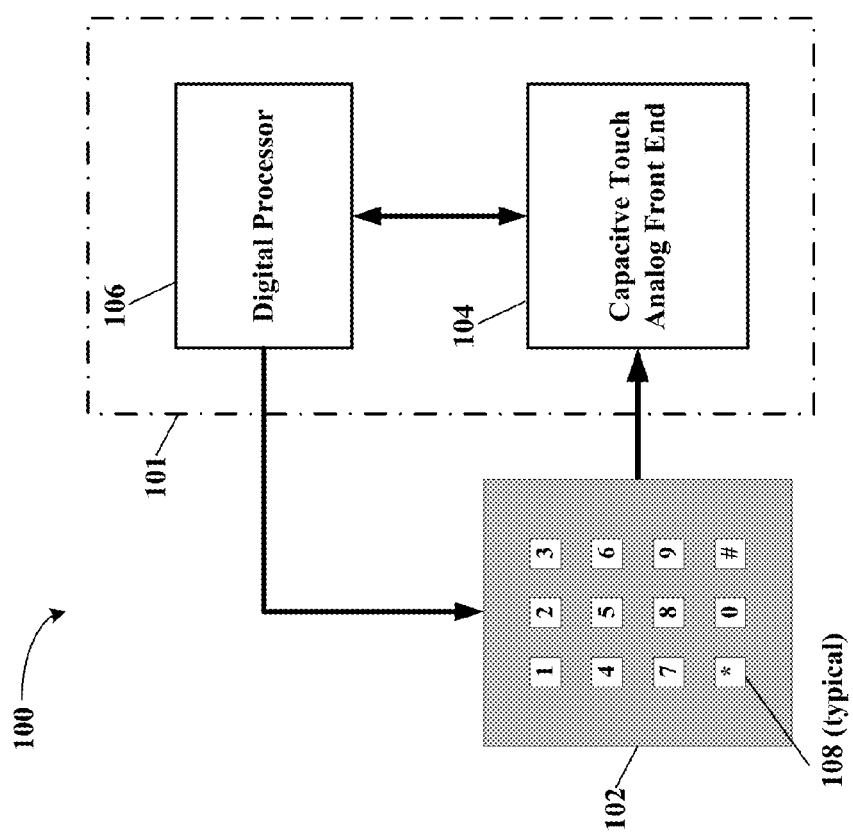
FIG. 1 illustrates a schematic block diagram of an electronic system having a capacitive touch keypad, a capacitive touch analog front end and a digital processor, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Microcontrollers now include peripherals that enhance the detection and evaluation of capacitive sensors. According to one embodiment, a capacitive voltage division (CVD) may be used to evaluate whether a capacitive touch element has been touched or not. However, when such sensors associated therewith are operated in high noise environments, the resolution or capacitive change detection in this capacitive measurement system may not suffice.

In particular parasitic capacitance may pose a problem in many capacitive sensor application. Parasitic capacitance is generated whenever a conductor adjacent to the sensor (or its connection to the microcontroller) is at a different voltage potential then the sensor. Thus there is a need to reduce the parasitic capacitance of capacitive sensors, in order to increase the resolution of the resulting CVD (capacitive voltage division) conversion process. According to various embodiments disclosed herein a voltage can be created approximating the sensor capacitance and driving conductive traces placed between the sensor (and its connection) and other conductors and/or ground plane in close proximity thereto.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of an electronic system having a capacitive touch keypad, a capacitive touch analog front end and a digital processor, according to the teachings of this disclosure. A microcontroller integrated circuit device 101 may comprise a digital processor 106, memory, one or more of input-output (I/O) ports (nodes), an analog-to-digital converter (ADC), precision timers, multifunction input and output nodes, charge time measurement unit (CTMU), multiplexers, digital-to-analog converter (DAC), or combinations thereof. A capacitive touch analog front end (AFE) 104 may be implemented with some of the aforementioned functions of the microprocessor 101. The capacitive touch AFE 104 may be coupled to a matrix of capacitive sensor keys 102, e.g., pushbuttons, levers, toggles, targets, handles, knobs, etc., through an analog multiplexer (not shown).

The capacitive touch AFE 104 facilitates, with a single low-cost integrated circuit microcontroller, all active functions used in determining when there is actuation of capacitive sensors by, for example but is not limited to, pressing and deflecting a target key that changes the capacitance value of an associated capacitive sensor. The capacitive touch AFE 104 measures the capacitance value of each sensor of the matrix of capacitive sensor keys 102 and converts the capacitance values into respective analog direct current (DC) voltages that are read and converted into digital values with an analog-to-digital converter (ADC) (not shown) and sent to the digital processor 106.

The digital processor 106 supplies clock and control functions to the capacitive touch AFE 104, reads the analog voltage detector output of the capacitive touch AFE 104, and selects each key of the matrix of capacitive sensor keys 102. When actuation of a key of the matrix of capacitive sensor keys 102 is determined, the digital processor 106 will take an appropriate action. More detailed descriptions of various capacitive touch systems are more fully disclosed in Microchip Technology Incorporated application notes AN1298, AN1325 and AN1334, available at www.microchip.com, and are hereby incorporated by reference herein for all purposes.

Referring to FIG. 2, depicted is a schematic elevational view of capacitive sensor keys shown in FIG. 1. A substrate 204, e.g., printed circuit board (PCB), may have a ground plane 206 (optional) that may be used for electromagnetic interference (EMI) shielding. Capacitive sensor plates 208 may be transposed on a face of the substrate 204 and in proximity to the ground plane 206 (optional). Other circuit conductors 210 (e.g., PCB traces) may also be in close proximity to the capacitive sensor plates 208. Touch targets 212 may lay over respective ones of the capacitive sensor plates 208 and may have an air gap 214 therebetween. It is contemplated and within the scope of this disclosure that a touch target 212, as shown in FIG. 2, may be replaced by any object that changes the capacitance of the capacitive sensor plate 208, e.g., a piece of metal, a finger, a hand, a foot, a leg, etc. Coverings 216 may be placed over the capacitive sensor plate 208 and/or be part of the touch targets 212 (optional) and may have alpha-numerical information engraved thereon. Each of the capacitive touch keys 108 comprises a sensor plate 208 and covering 216. Dielectric spacers 218 are located between each of the capacitive touch keys 108. Optionally, a touch target 212 may be added over each respective sensor plate 208.

Figures 5, 6:
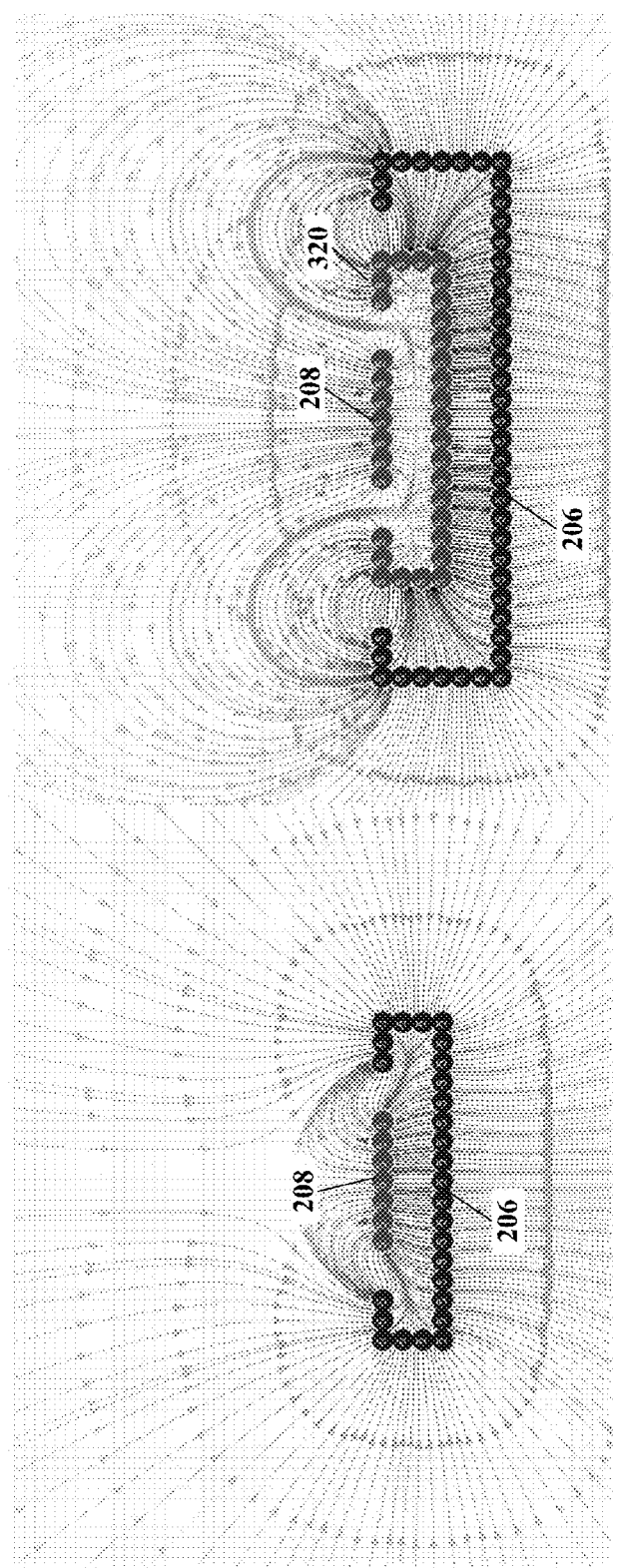
FIG. 5 illustrates a schematic elevational view of electrostatic field lines surrounding a capacitive sensor and grounded shield.
FIG. 6 illustrates a schematic elevational view of electrostatic field lines surrounding a capacitive sensor, guard ring and grounded shield, according to the teachings of this disclosure.

The ground plane 206 (optional) and/or circuit conductors 210 may be at different voltage potentials then the capacitive sensor plates 208. This creates parasitic capacitance between the capacitive sensor plate 208 and portions of the ground plane 206 (optional) and/or circuit conductors 210 in close proximity to the capacitive sensor plate 208. See FIG. 5 for a schematic representation of electrostatic fields between the capacitive sensor plate 208 and surrounding conductors at different voltage potential. Note the strong electrostatic field lines between the capacitive sensor plate 208 and the surrounding conductors. This parasitic capacitance limits detection resolution of a change in the capacitance value of the capacitive sensor plate 208 occurring during a touch thereto. Parasitic capacitance similarly affects the connections between the capacitive sensor plates 208 and the AFE 104. It also limits the amount of noise shielding that may be employed in capacitive touch systems.

Referring to FIG. 3, depicted is a schematic elevational view of capacitive sensor keys shown in FIG. 1 and having capacitive guard rings around each of the capacitive sensors, according to a specific example embodiment of this disclosure. A guard ring 320 around each of the capacitive sensor plates 208 is added to the capacitive sensor keys 102a. Otherwise all other elements are substantially the same as the capacitive sensor keys 102 shown in FIG. 2. By maintaining a voltage on the guard rings 320 that is substantially the same as the voltage on the respective capacitive sensor plate 208, parasitic capacitances are significantly reduced. Thereby increasing detection resolution of a change in the capacitance value of the capacitor sensor plate 208 occurring during a touch thereto. In addition, providing for enhanced noise shielding does not affect the detection resolution as it would in the configuration shown in FIG. 2. See FIG. 6 for a schematic representation of electrostatic fields between the capacitive sensor plate 208, guard ring 320, surrounding ground plane 206 (optional) and conductors 210 (not shown), wherein the capacitive sensor plate 208 and the guard ring 320 are at substantially the same voltage potential. Note the much weaker electrostatic field lines (longer lines) between the capacitive sensor plate 208 and the surrounding conductors and the ground plane 206 (optional). There is substantially no parasitic capacitance between the capacitive sensor plate 208 and the guard ring 320 because both are at substantially the same voltage potential.

Figure 4:
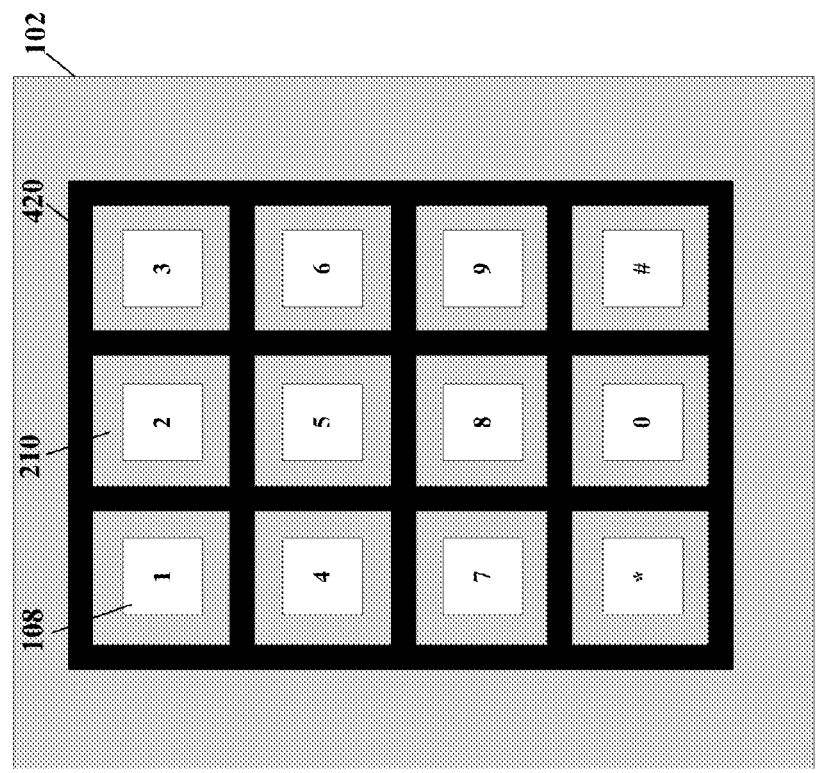
FIG. 4 illustrates a schematic plan view of capacitive sensor keys shown in FIG. 1 and having guard rings around each of the capacitive sensors, according to another specific example embodiment of this disclosure.

Referring to FIG. 4, depicted is a schematic plan view of capacitive sensor keys shown in FIG. 1 and having guard rings around each of the capacitive sensors, according to another specific example embodiment of this disclosure. Each of the capacitive sensor plates 208 of the touch keys 108 are surrounded by guard rings 420 that are electrically coupled together and have the same voltage potential thereon. In this configuration only one capacitive sensor plate 208 capacitance value is determined at a time so the entire matrix of guard rings 420 assumes the voltage potential of the capacitive sensor plate 208 having its capacitance value determined by the AFE 104 and digital processor 106, as more fully described hereinafter.

Each of the guard rings 320 shown in FIG. 3 may be independent of one another and have different voltages thereon, but would require more connections to the digital processor 106. So unless simultaneous capacitance readings of more than one capacitive sensor plate 208 needs to be determined at the same time, the single voltage potential guard rings 420 (FIG. 4) would suffice and require fewer circuit connections to the digital processor 106.

Figure 7:
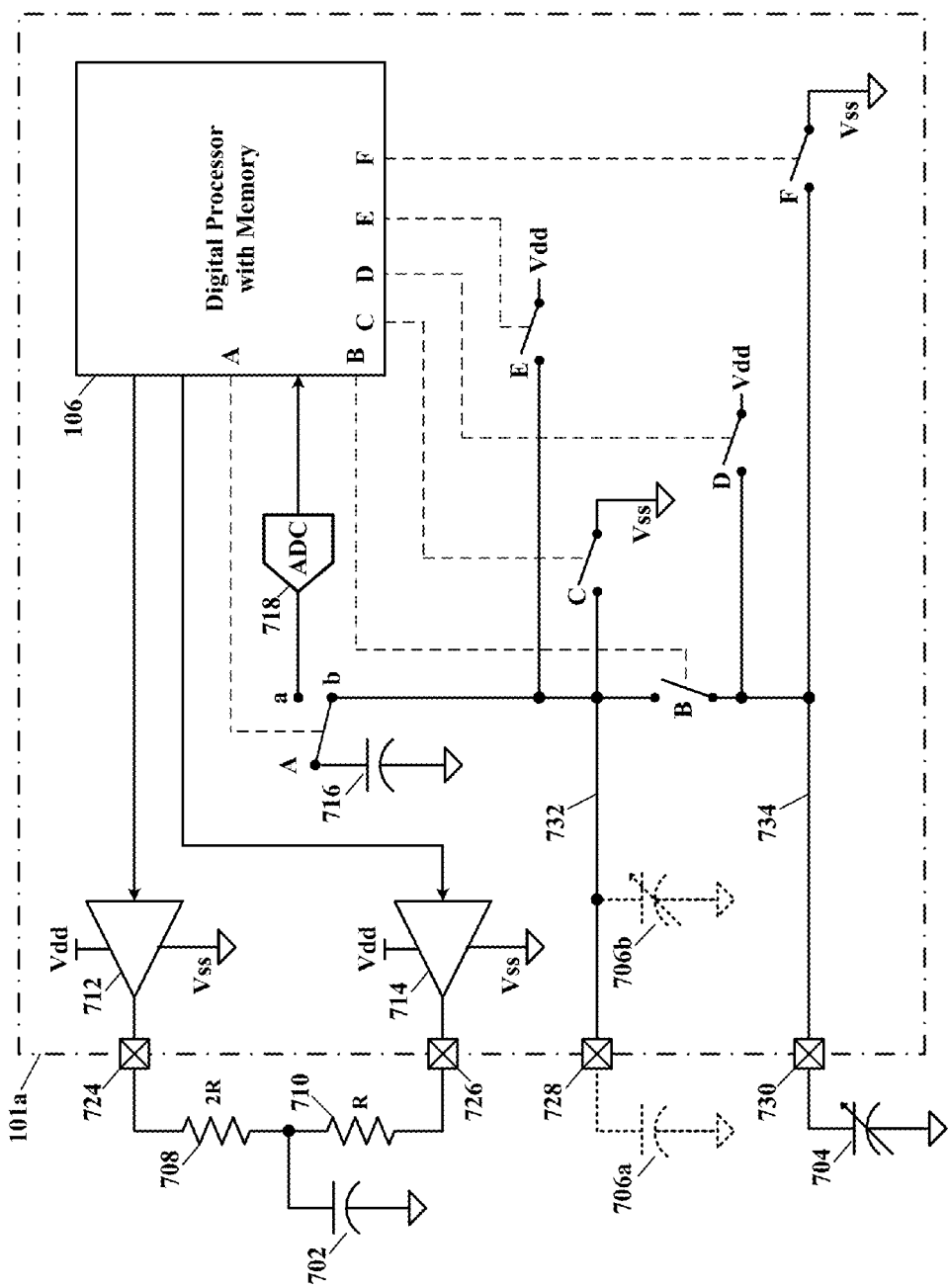
FIG. 7 illustrates a schematic diagram of a mixed signal integrated circuit device having CVD processing capabilities for a capacitive sensor and associated guard ring, according to a specific example embodiment of this disclosure.

Referring to FIG. 7, depicted is a schematic diagram of a mixed signal integrated circuit device having CVD processing capabilities for a capacitive sensor and associated guard ring, according to a specific example embodiment of this disclosure. The mixed signal integrated circuit device 101a shown in FIG. 7, e.g., a microcontroller, is applicable when using the capacitive voltage divider (CVD) method of determining the capacitance value of the capacitive sensor plate 208. By first determining the capacitance value of an untouched capacitive sensor plate 208 and then determining a subsequent capacitance value of a touched capacitive sensor plate 208, a touch to that capacitive sensor plate 208 may be determined based upon the change in capacitance thereof. In CVD two capacitors are charged/discharged to opposite voltage values. Then the two oppositely charged capacitors are coupled together and a resulting voltage is measured on the connected two capacitors. A more detailed explanation of CVD is presented in commonly owned United States Patent Application Publication No. US 2010/0181180, incorporated by reference herein for all purposes. The switches shown in FIG. 7 may be, for example but are not limited to, field effect transistor (FET) switches. The nodes 728 and 730 are analog nodes coupled to respective internal single line (conductor) analog buses 732 and 734, respectively.

The capacitance of the capacitive sensor plate 208 is represented by variable capacitor 704 (first CVD capacitor), and the second CVD capacitor may be the sample and hold capacitor 716 if these two capacitors have fairly close capacitive values e.g., 1:1 to about 3:1. The reason for this in CVD is that part of the charge from one capacitor is transferred to the other capacitor having no charge or an opposite charge. For example, when the two CVD capacitors are equal in value, half of the charge on one will be transferred to the other capacitor. A two to one capacitance ratio will result in ⅓ of the charge being transferred to or taken from the smaller (½C) capacitor depending upon which of one the capacitors was initially charged. When the sample and hold capacitor 716 is substantially smaller than the capacitive sensor capacitor 704, additional capacitance 706a may be added externally to node 728, and/or internal capacitance 706b may be added independently of node 728 so that the combined capacitance of the capacitors 716, 706a and/or 706b have sufficient capacitance in relation to the capacitance value of the capacitive sensor capacitance 704 to meet the criteria above. This results in the best resolution in determining a capacitance value using CVD. Capacitor 716 is also the sample and hold capacitor used to sample and hold the analog voltage resulting after charge is transferred between the two CVD capacitors. Once the charge transfer is complete, an analog-to-digital converter (ADC) 718 converts the resulting charge voltage to a digital value that is read by the digital processor 106 for further processing and determination of the capacitance value of the touch sensor capacitor 704.

In the example hereinafter presented, the capacitance values for the capacitor 704 (first CVD capacitor), capacitor 706a (an externally connected capacitor) and/or capacitor 706b (an internally connected capacitor) may be selected in combination with the sample and hold capacitor 716 to result in a combined charge voltage of ⅓ or ⅔ of the Vdd voltage depending on whether the first CVD capacitor 704 is discharged to Vss or charged to Vdd, and the combination of capacitors 706 and 716 are charged to Vdd or discharged to Vss, respectively. In this example, the capacitor 704 is about twice the capacitance as the capacitance of the parallel connected combination of capacitors 706 and 716. The resulting quiescent voltage after coupling the two opposite polarity charged CVD capacitors together will be about ⅓*Vdd when the capacitor 704 was initially discharged to Vss, and about ⅔*Vdd when the capacitor 704 was initially charged to Vdd.

Knowing the expected quiescent voltages of the combination of all capacitors connected in parallel allows creating the appropriate voltages for the guard ring 320 or 420 surrounding the respective sensor plate 208 being evaluated for a capacitance value by the digital processor 106. When Vdd is desired on the guard ring 320 or 420, both outputs from the digital drivers 712 and 714 are at substantially Vdd (logic high). When Vss is desired on the guard ring 320 or 420, both outputs from the digital drivers 712 and 714 are at substantially Vss (logic low). When ⅓*Vdd is desired on the guard ring 320 or 420, the output from the digital driver 714 is at Vss (logic low) and the output from the digital driver 712 is at substantially Vdd (logic high). When ⅔*Vdd is desired on the guard ring 320 or 420, the output from the digital driver 714 is at Vdd (logic high) and the output from the digital driver 712 is at substantially Vss (logic low).

By proper selection of a capacitance value for capacitor 706, and resistance values for resistors 708 and 710, guard ring voltages may easily be generated by the digital processor 106 using just two digital outputs at nodes 724 and 726. Other voltage ratios may also be effectively used by proper selection of values for capacitor 706 and resistors 708 and 710. For example, if the combined capacitance of capacitors 706 and 716 are substantially equal to the capacitance of capacitor 704, the subsequent combined voltage will be ½*Vdd and the resistors 708 and 710 will be substantially the same resistance to produce ½*Vdd on the guard ring capacitance when appropriate.

Figure 7A:
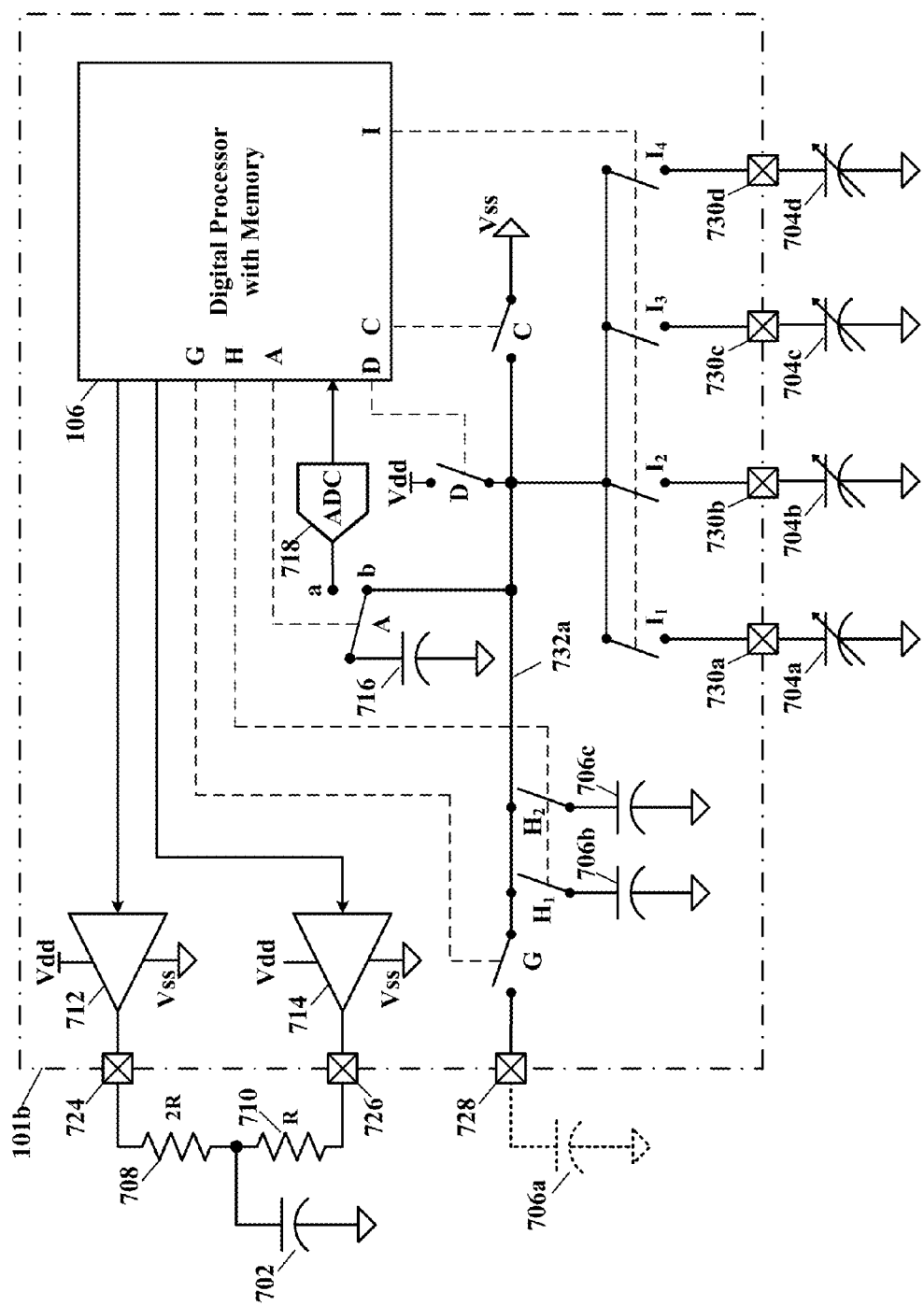
FIG. 7A illustrates a schematic diagram of a mixed signal integrated circuit device having CVD processing capabilities for a plurality of capacitive sensors and a guard ring, according to another specific example embodiment of this disclosure.

Referring to FIG. 7A, depicted is a schematic diagram of a mixed signal integrated circuit device having CVD processing capabilities for a plurality of capacitive sensors and a guard ring, according to another specific example embodiment of this disclosure. The mixed signal integrated circuit device 101b shown in FIG. 7A, e.g., a microcontroller, performs substantially the same as the device 101a shown in FIG. 7 except that there is only one single wire analog bus 732a; wherein internal capacitors 706b and 706c are decoupled from the bus 732a with switches H, and the external node 728 is decoupled from the bus 732a with switch G. Only one set of Vdd/Vss switches D and C are used wherein the first CVD capacitor 704 is charged/discharged during a different time period then the second CVD capacitor 716 (and 706) is discharged/charged. This saves a set of switches and a second internal analog bus (see FIG. 7 bus 734).

In addition, a plurality of switches I are used to multiplex each of the capacitive sensors 704 used in the capacitive touch keys 108 shown in FIG. 1. These features may also be incorporated into the circuit of FIG. 7. The analog multiplexer switches I select respective ones of the plurality of sensor capacitors 704 as the capacitive touch analog front end 104 scans the capacitive touch keys 108. The plurality of nodes 730 are typically multi-purpose programmable analog or digital inputs and/or outputs. For explanatory clarity in this disclosure only analog input/output (two way) configured nodes are shown. The digital processor, through the digital drivers 712 and 714, drives nodes 724 and 726 to appropriate logic levels for the selected one of the plurality of sensor capacitors 704.

Figure 8:
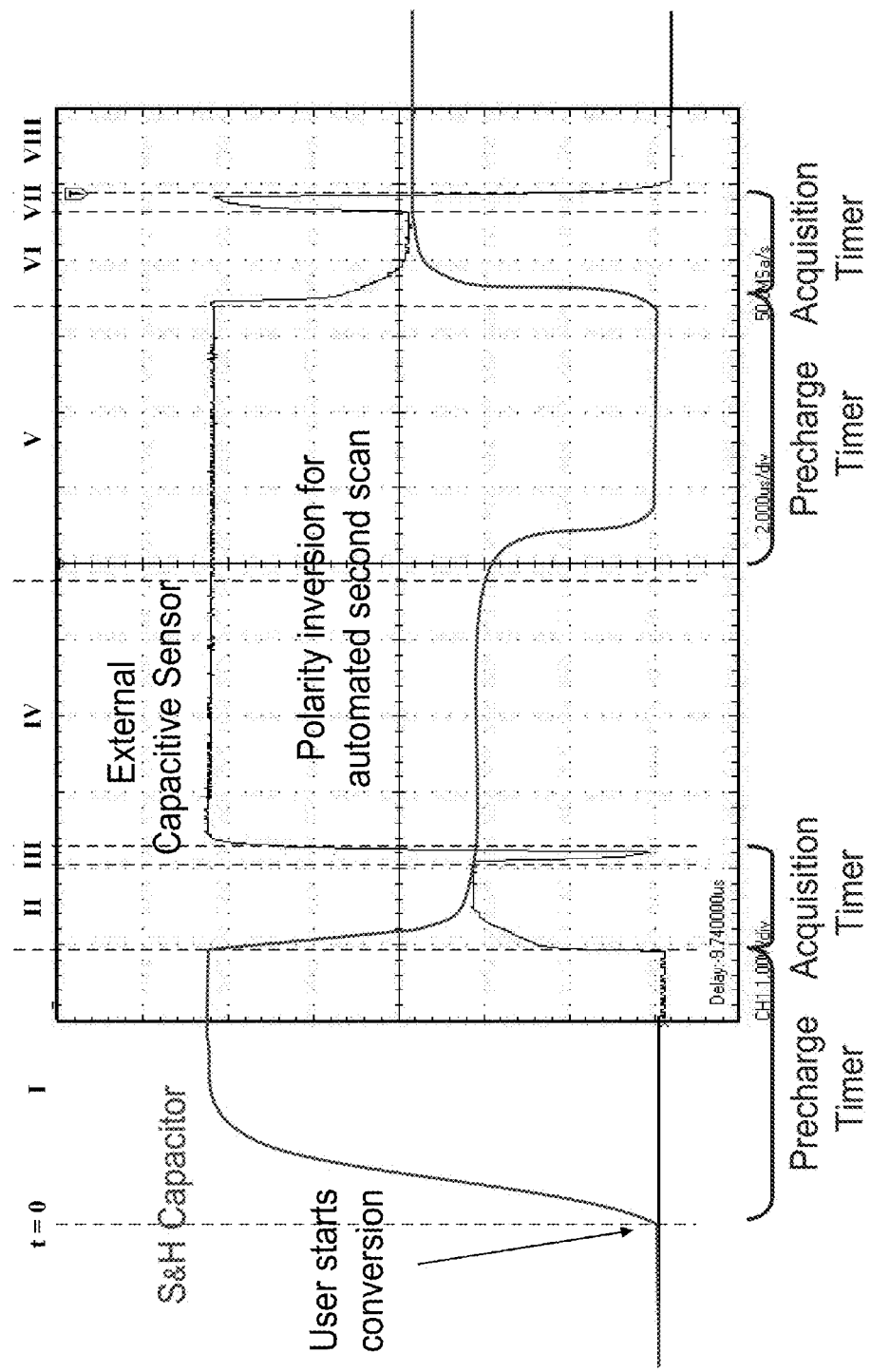
FIG. 8 illustrates a schematic voltage-time diagram of capacitance conversions, according to the teachings of this disclosure.
Figure 9:
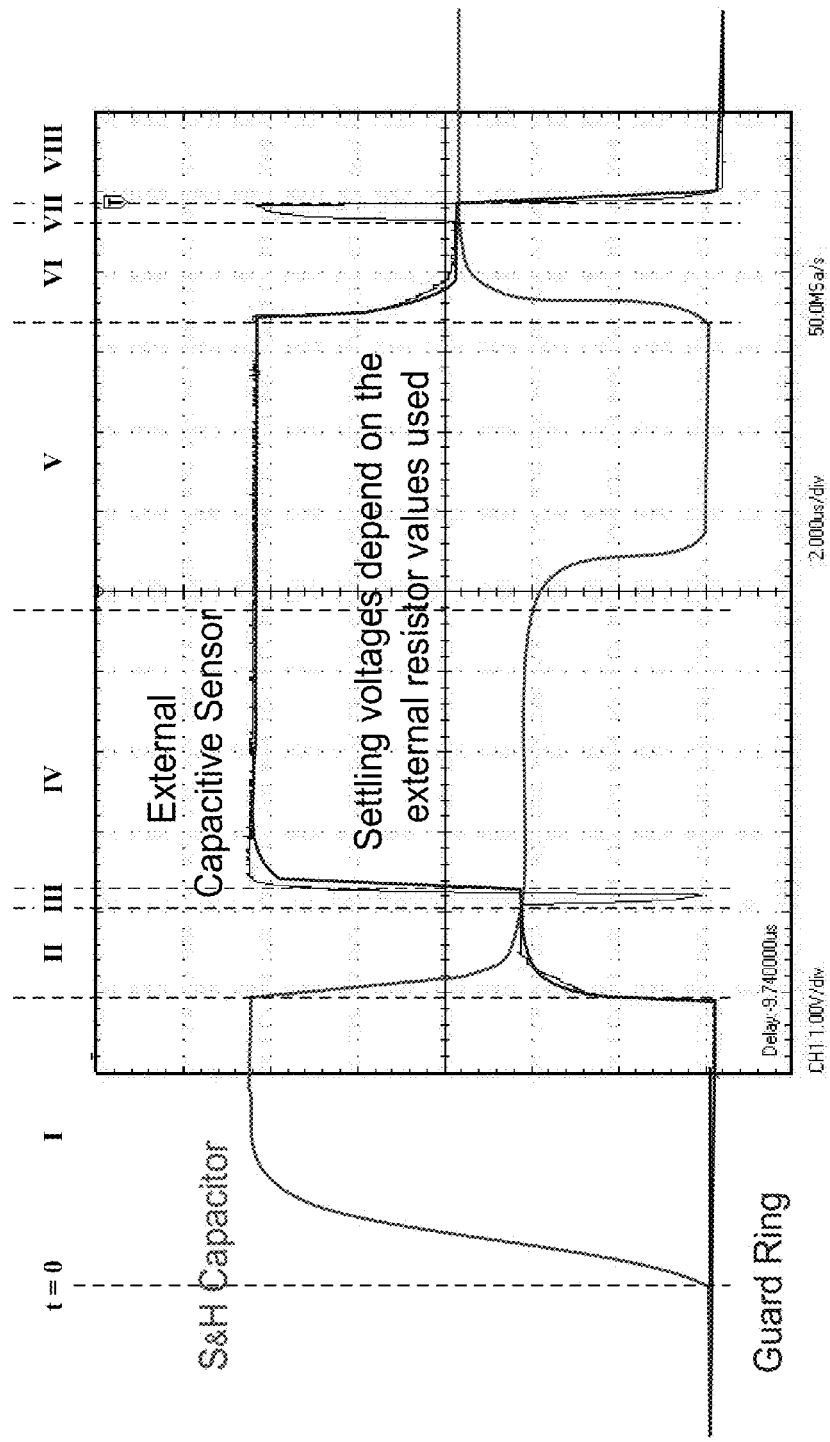
FIG. 9 illustrates a schematic voltage-time diagram of capacitance conversions and guard ring voltage control during these conversions, according to a specific example embodiment of this disclosure.

Referring to FIGS. 8 and 9, depicted are schematic voltage-time diagrams of capacitance conversions (FIG. 8), and guard ring voltage control (FIG. 9) during these conversions, according to a specific example embodiment of this disclosure. In segment I the capacitors 706 and 716 (sample and hold capacitor) are charged to Vdd, the capacitive sensor capacitor 704 is discharged to Vss, and the guard ring capacitance 702 is discharged to Vss (substantially matching the voltage on the capacitor 704). In segment II the capacitors 706, 716 and 704 are coupled together and a quiescent voltage of about ⅓*Vdd will result when the capacitive touch key 108 is not depressed, and a little less than ⅓*Vdd when depressed. The guard ring capacitance 702 follows the voltage on the capacitor 704 (capacitive sensor) so as to minimize any parasitic capacitances therebetween. Toward the end of segment II the sample and hold capacitor 716 decouples from the capacitors 706 and 704 and retains the quiescent voltage obtained during segment II. In segment III any voltage charge on the capacitor 704 (capacitive sensor) is discharged to substantially Vss, then at the beginning of segment IV the capacitor 704 (capacitive sensor) and the guard ring capacitance 702 are charged to substantially Vdd. Meantime also in segment IV the quiescent voltage stored on the sample and hold capacitor 716 is converted by the ADC 718 to a digital value representing the quiescent voltage and read by the digital processor 106. The digital value from the ADC 718 is used in determining whether the capacitive sensor was being actuated (touched), e.g., quiescent voltage lower then what is expected from a non-actuated touch sensor or not. When the capacitive value of the touch sensor capacitor 704 is actuated (touched) its capacitance increases and the subsequent quiescent voltage will thereby be less then when not actuated. This is true when the capacitor 704 is initialized to Vss. When the capacitor 704 is initialized to Vdd, the subsequent quiescent voltage is about ⅔*Vdd when the capacitive sensor is not actuated.

In segment V the capacitors 706 and 716 (sample and hold capacitor) are discharged to Vss, the capacitive sensor capacitor 704 and guard ring capacitance 702 have already been charged to Vdd. In segment VI the capacitors 706, 716 and 704 are coupled together and a quiescent voltage of about ⅔*Vdd will result when the capacitive touch key 108 is not depressed, and a little more than ⅔*Vdd when depressed. The guard ring capacitance 702 follows the voltage on the capacitor 704 (capacitive sensor) so as to minimize any parasitic capacitances therebetween. Toward the end of segment VI the sample and hold capacitor 716 decouples from the capacitors 706 and 704 and retains the quiescent voltage obtained during segment VI. In segment VII the capacitor 704 (capacitive sensor) is charged to substantially Vdd, then at the beginning of segment VIII the capacitor 704 (capacitive sensor) and the guard ring capacitance 702 are discharged to substantially Vss. Meantime also in segment VIII the quiescent voltage stored on the sample and hold capacitor 716 is converted by the ADC 718 to a digital value representing the quiescent voltage and read by the digital processor 106. The digital value from the ADC 718 is used in determining whether the capacitive sensor was being actuated (touched), e.g., quiescent voltage lower then what is expected from a non-actuated touch sensor or not. When the capacitive value of the touch sensor capacitor 704 is actuated (touched) its capacitance increases and the subsequent quiescent voltage will thereby be greater than when not actuated. This is true when the capacitor 704 is initialized to Vdd. When the capacitor 704 is initialized to Vss, the subsequent quiescent voltage is about ⅓*Vdd when the capacitive sensor is not actuated, as described hereinabove. These sequences repeat for each one of the touch keys 108. Also by inverting the voltage charge polarities every other capacitive measurement cycle and averaging the capacitive measurement values, a type of differential operation is achieved that minimizes common mode noise and interference, e.g., 60 Hz power line interference.

Figure 10:
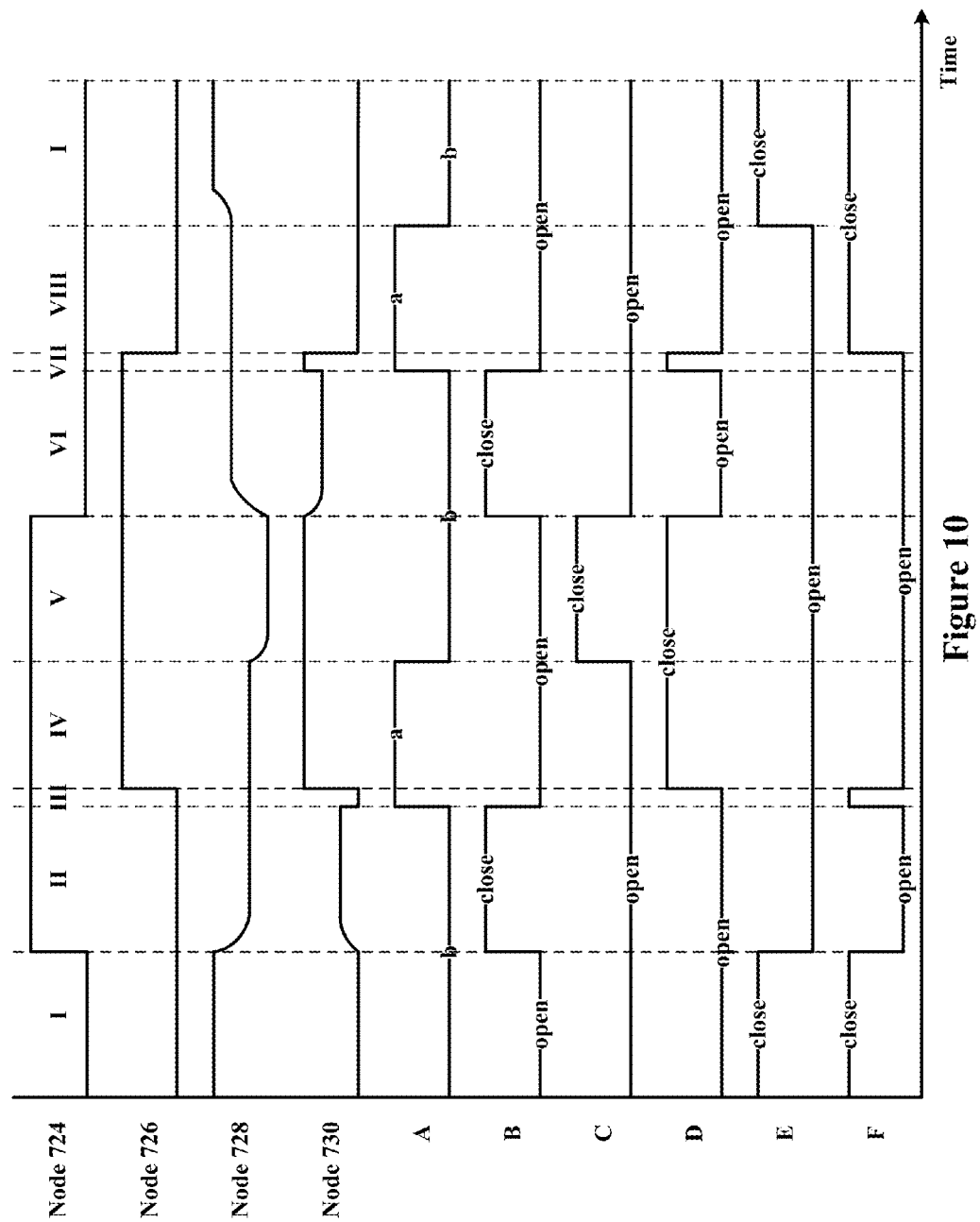
FIG. 10 illustrates a schematic timing diagram of the capacitive conversion system shown in FIG. 7.

Referring to FIG. 10, depicted is a schematic timing diagram of the capacitive conversion system shown in FIG. 7. This schematic timing diagram clearly represents a specific example operational embodiment of the circuit shown in FIG. 7. Voltages on nodes 724, 726, 728 and 730 are shown in relation to the operational open and close combinations of switches A-F. FIG. 10 basically represents the same voltage and timing waveforms as shown in FIG. 9. It is contemplated and within the scope of this disclosure that other and further circuit designs and timing diagrams could be used with equal effect, and one having ordinary skill in electronic circuit design and having the benefit of this disclosure could replicate the results described herein.

Figure 11:
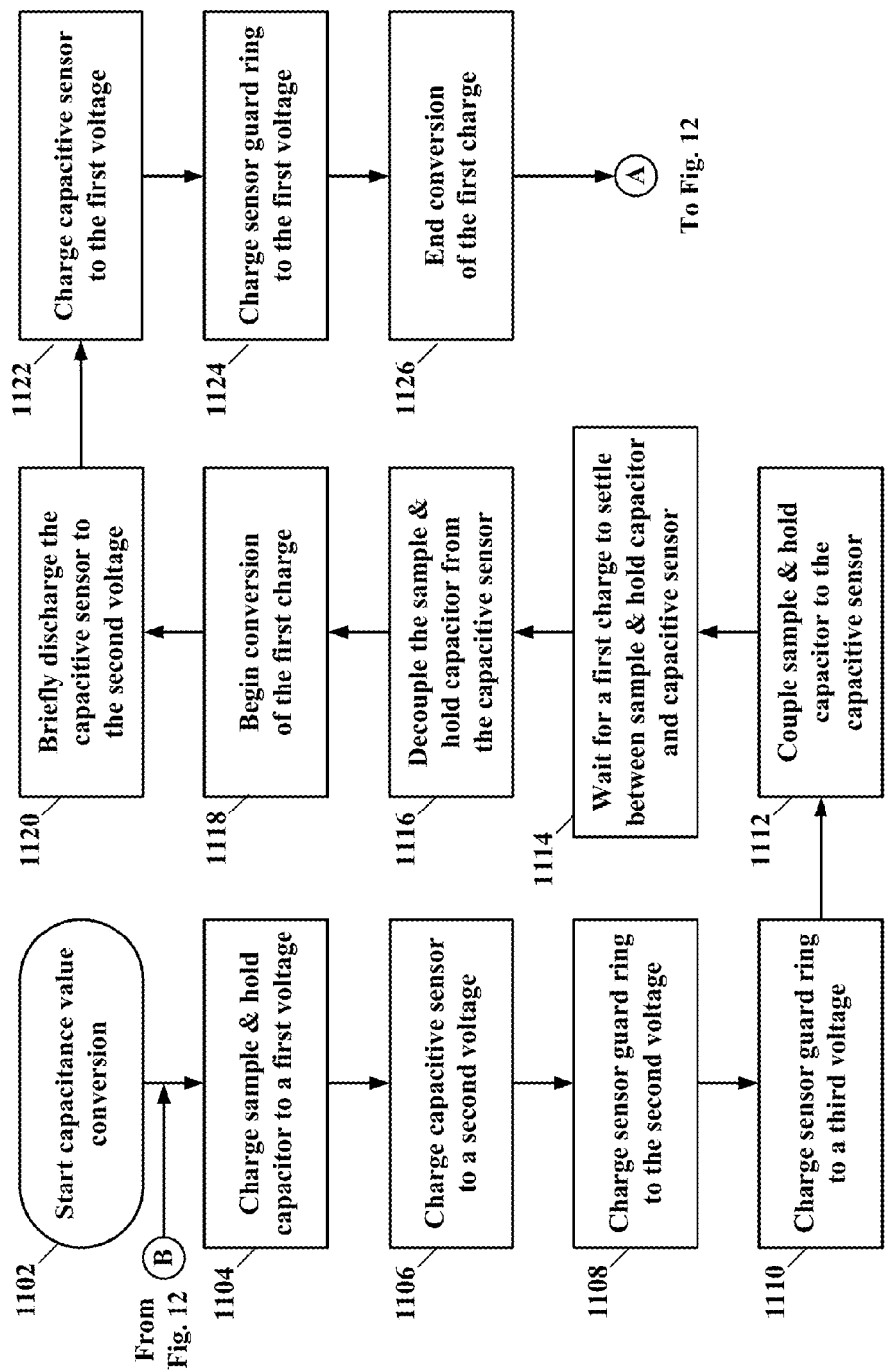
FIGS. 11 and 12 show schematic process flow diagrams of capacitive conversions, according to a specific example embodiment of this disclosure.
Figure 12:
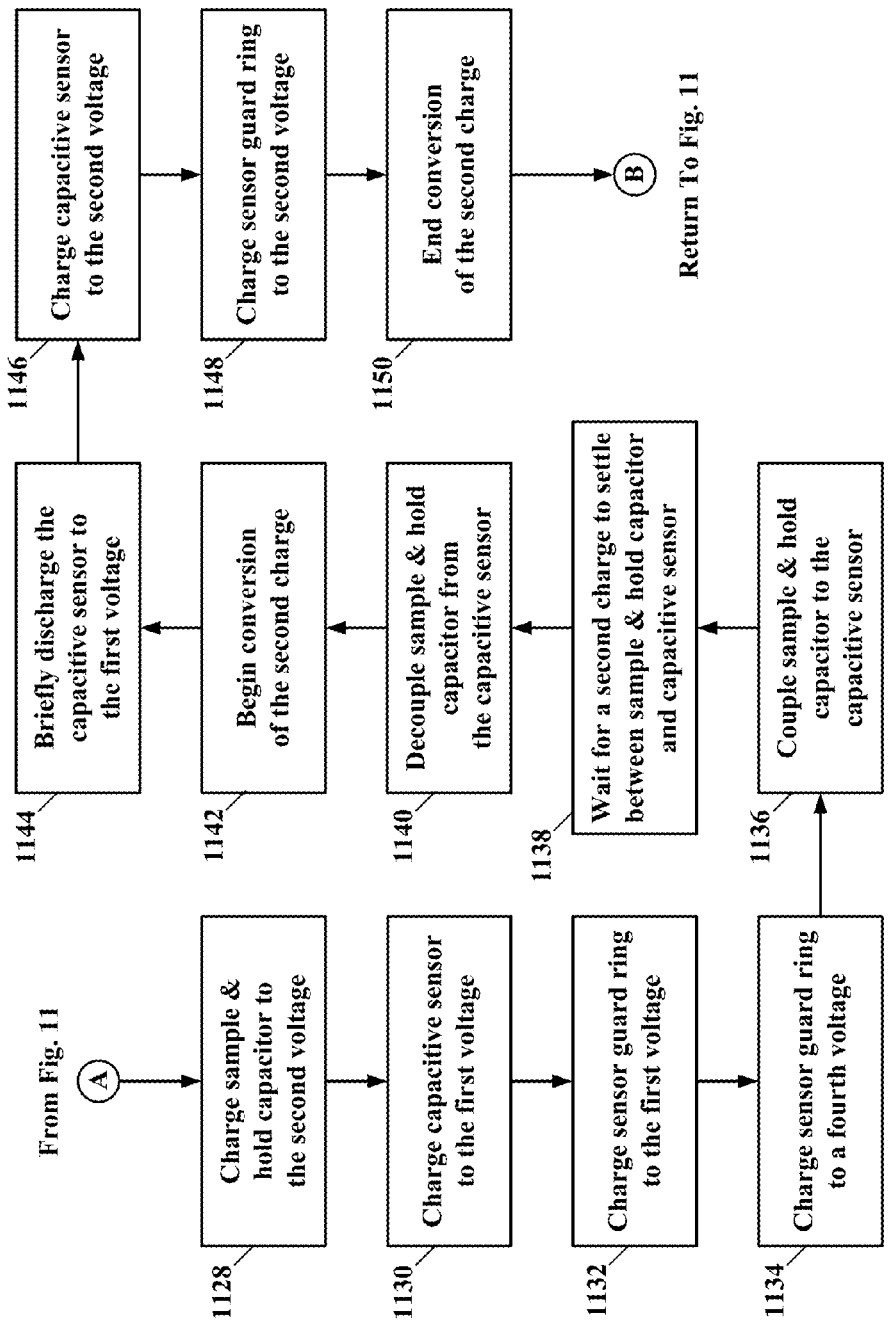

Referring to FIGS. 11 and 12, depicted are schematic processor flow diagrams of capacitive conversions, according to a specific example embodiment of this disclosure. In step 1102 a capacitance value conversion is started. In step 1104 the sample and hold capacitor combination of the capacitors 706 and 716 are charged to a first voltage. In step 1106 the capacitive sensor is charged to a second voltage. The first voltage may be Vdd and the second voltage may be Vss or visa versa. In step 1108 the capacitive sensor guard ring is charged to the second voltage so as to minimize parasitic capacitance that would otherwise develop at the capacitive sensor due to electrostatic charge caused by a difference of voltage potential between the capacitive sensor and adjacent conductors.

Next in step 1110 the sensor guard ring is charged/discharged to a third voltage contemporaneously with execution of step 1112 in which the sample and hold capacitor combination, previously charged to the first voltage, is coupled to the capacitive sensor, previously charged to the second voltage. Steps 1110 and 1112 may be interchanged so long as both occur contemporaneously with each other. In step 1114 the sample and hold capacitor and the capacitive sensor are coupled together long enough in time for a complete settling to a quiescent first charge. Then in step 1116 the sample and hold capacitor is decoupled from the capacitive sensor and the sample and hold capacitor thereafter retains the settled first charge. In step 1118 conversion to a digital representation of the first charge stored in the sample and hold capacitor begins.

In step 1120 the capacitive sensor is briefly discharged to the second voltage. In step 1122 the capacitive sensor is charged to the first voltage. In step 1124 the capacitive sensor guard ring is charged to the first voltage so as to minimize parasitic capacitance that would otherwise develop at the capacitive sensor due to electrostatic charge caused by a difference of voltage potential between the capacitive sensor and adjacent conductors. In step 1126 the conversion of the first charge to a digital representation thereof terminates and is then read by the digital processor 106 for determining the capacitance value of the capacitive sensor 108.

In step 1128 the sample and hold capacitor combination of the capacitors 706 and 716 are charged to the second voltage. In step 1130 the capacitive sensor is charged to the first voltage. In step 1132 the capacitive sensor guard ring is charged to the first voltage so as to minimize parasitic capacitance that would otherwise develop at the capacitive sensor due to electrostatic charge caused by a difference of voltage potential between the capacitive sensor and adjacent conductors.

Next in step 1134 the sensor guard ring is charged/discharged to a fourth voltage contemporaneously with execution of step 1136 in which the sample and hold capacitor combination, previously charged to the second voltage level, is coupled to the capacitive sensor, previously charged to the first voltage. Steps 1134 and 1136 may be interchanged so long as both occur contemporaneously with each other. In step 1138 the sample and hold capacitor combination and the capacitive sensor are coupled together long enough in time for a complete settling to a quiescent second charge. Then in step 1140 the sample and hold capacitor is decoupled from the capacitive sensor and the sample and hold capacitor thereafter retains the settled second charge). In step 1142 a conversion to a digital representation of the second charge stored in the sample and hold capacitor begins.

In step 1144 the capacitive sensor is briefly discharged to the first voltage. In step 1146 the capacitive sensor is charged to the second voltage. In step 1148 the capacitive sensor guard ring is charged to the second voltage so as to minimize parasitic capacitance that would otherwise develop at the capacitive sensor due to electrostatic charge caused by a difference of voltage potential between the capacitive sensor and adjacent conductors. In step 1150 the conversion of the second charge to a digital representation thereof terminates and is then read by the digital processor 106 for determining the capacitance value of the capacitive sensor 108. The digital representations of the first and second charges may thereafter be processed to reduce common mode noise and interference, e.g., 60 Hz power line interference.

Figure 13:
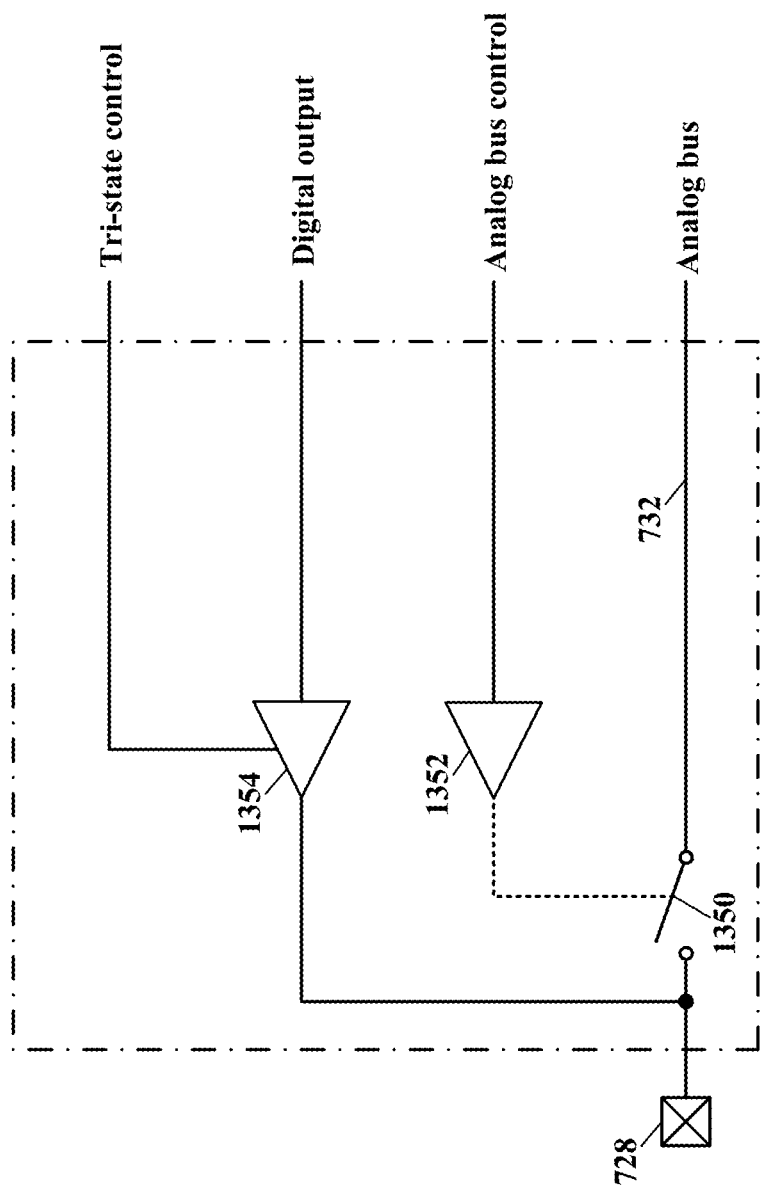
FIG. 13 illustrates a schematic block diagram of multifunction port logic that supports a digital I/O and an analog function via an analog pass gate switch, according to the teachings of this disclosure.

Referring to FIG. 13, depicted is a schematic block diagram of multi-function port logic that supports a digital I/O and an analog function via an analog pass gate switch, according to the teachings of this disclosure. A digital driver 1354 having a tri-state output is coupled to the external node 728 and is controlled by a tri-state control signal from, for example but is not limited to, the digital processor 106. A digital output signal from, for example but is not limited to, the digital processor 106 is coupled to an input of the digital driver 1354.

An analog pass gate switch 1350, which for example may implement switch G in FIG. 7A, is controlled by analog switch logic 1352 that may be controlled by an analog bus control signal, independent form the ADC channel selection, from, for example but is not limited to, the digital processor 106. Generally an analog multiplexer for the internal ADC is configured to allow only one of the multiple switches to close so that only one of the external pins at a time is connected to the internal ADC. However, according to another embodiment, an analog multiplexer for the ADC may be configured to allow that more than one switch can be controlled to connect an external pin to the analog bus. Hence, the control logic 1352 and analog pass gate switches 1350 may either be controlled independently from the analog multiplexer or may be part of the analog multiplexer. The analog pass gate switch 1350 when closed enables direct coupling of the node 728 to an analog bus 732, as more fully described hereinabove. When the analog pass gate switch 1350 is closed, the output of the digital driver 1354 is put into a high impedance state by the tri-state control, thereby minimally affecting the node 728 when being used as an analog port. It is contemplated and within the scope of this disclosure that other functions may be included according to other embodiments described herein.

Figure 14:
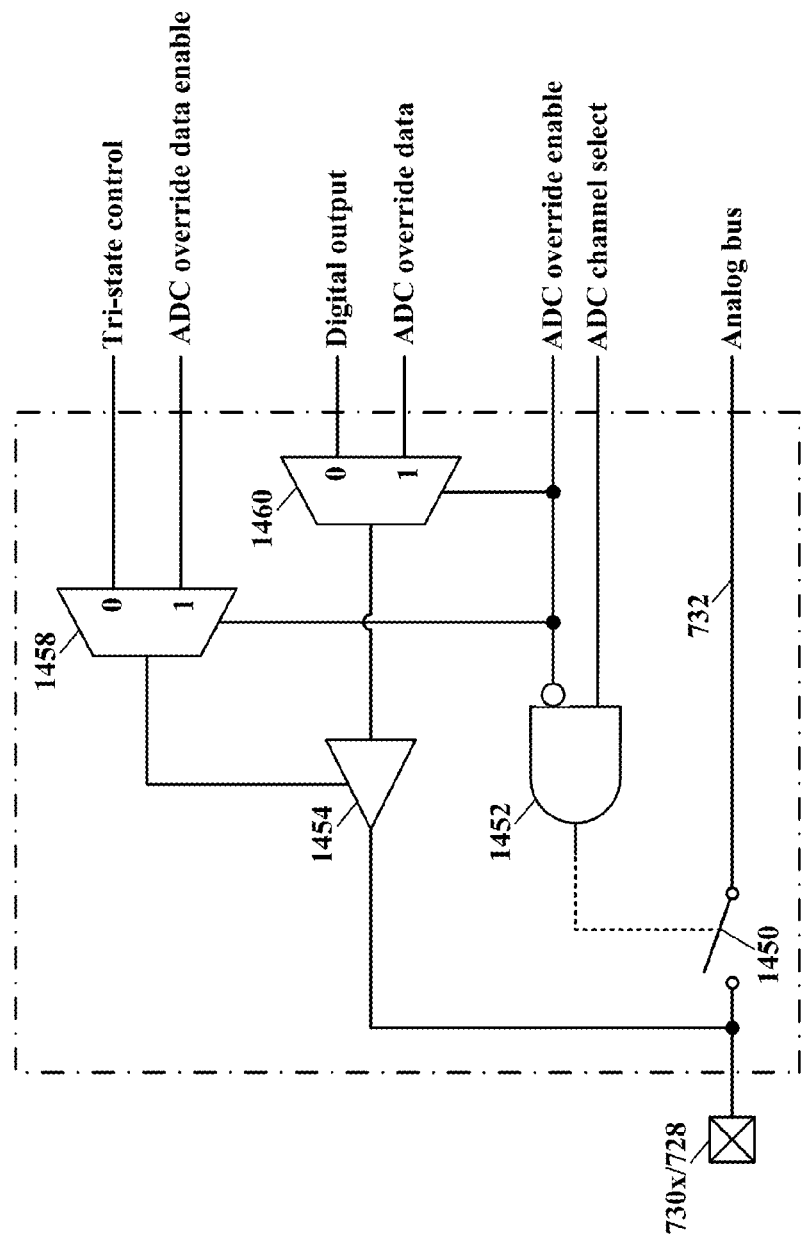
FIG. 14 illustrates a schematic block diagram of multifunction port logic that supports a digital I/O and an analog function via an analog pass gate switch wherein the analog function can be overridden to precharge and discharge a capacitive touch sensor connected to the port with ADC controller logic, according to the teachings of this disclosure.

Referring to FIG. 14, depicted is a schematic block diagram of multi-function port logic that supports a digital I/O and an analog function via an analog pass gate switch wherein in addition the analog function can be overridden to precharge and discharge a capacitive touch sensor connected to the port with ADC controller logic, according to the teachings of this disclosure. Such a port logic may be used for any of the external pins 730 and when the analog multiplexer is configured to allow more than one switch to be closed then also for pin 728. Switching between digital and analog functions at the node 730 can be processor intensive and may require a complex program to properly handle all related digital and analog functions required of the node 730, as more fully described hereinabove. In order to take the load, e.g., program steps and/or control functions, off of the processor 106 during setup and determination, e.g., FIGS. 8-12, of the capacitance value of each capacitive sensor, an ADC override feature may be incorporated into the capacitive touch determination circuits described herein. Use of a dedicated ADC controller incorporating the circuit functions shown in FIG. 14 will save digital processor program steps and allow for the processor to perform other functions during determination of the capacitive sensor capacitance. However, according to other embodiments, the override function can also be omitted. Also, according to yet other embodiments, the port logic as shown in FIGS. 13 and 14 may be combined to create a universal port logic for each external pin, as for example, shown in FIG. 7A. Thus, a universal port logic for all external pins may have two pass gates which can be controlled independently to connect to the analog bus or may have a single pass gate which is part of the analog multiplexer that allows to be controlled by an independent enable signal.

A digital driver 1454 having a tri-state output is coupled to the external node 730 and is controlled by a tri-state control signal from a multiplexer 1458. A digital output signal from a multiplexer 1460 is coupled to an input of the digital driver 1454. An analog pass gate switch 1450, which may implement the switch I in FIG. 7A, is controlled by analog switch logic 1452. When the ADC override enable signal is at a logic low the multiplexer 1458 couples the tri-state control signal to control the tri-state output of the digital driver 1454, and the multiplexer 1460 couples the digital output signal to the input of the digital driver 1454. The ADC channel select (analog bus control) controls the analog pass gate switch 1450 to directly couple the node 730 to the analog bus 732, as more fully described hereinabove. In this configuration, the circuit shown in FIG. 14 functions in substantially the same fashion as the circuit shown in FIG. 13.

However, when the ADC override enable signal is at a logic high the multiplexer 1458 couples the ADC override data enable signal to control the tri-state output of the digital driver 1454, and the multiplexer 1460 couples the ADC override data signal to the input of the digital driver 1454. The analog pass gate switch 1450 is forced to decouple the analog bus 732 from the node 730. In this configuration the ADC override data enable and ADC override data signals may be provided by an ADC logic controller (not shown), and may be used to charge or discharge a capacitive touch sensor coupled to the node 730 without requiring program intensive actions from the digital processor 106.

Figure 15:
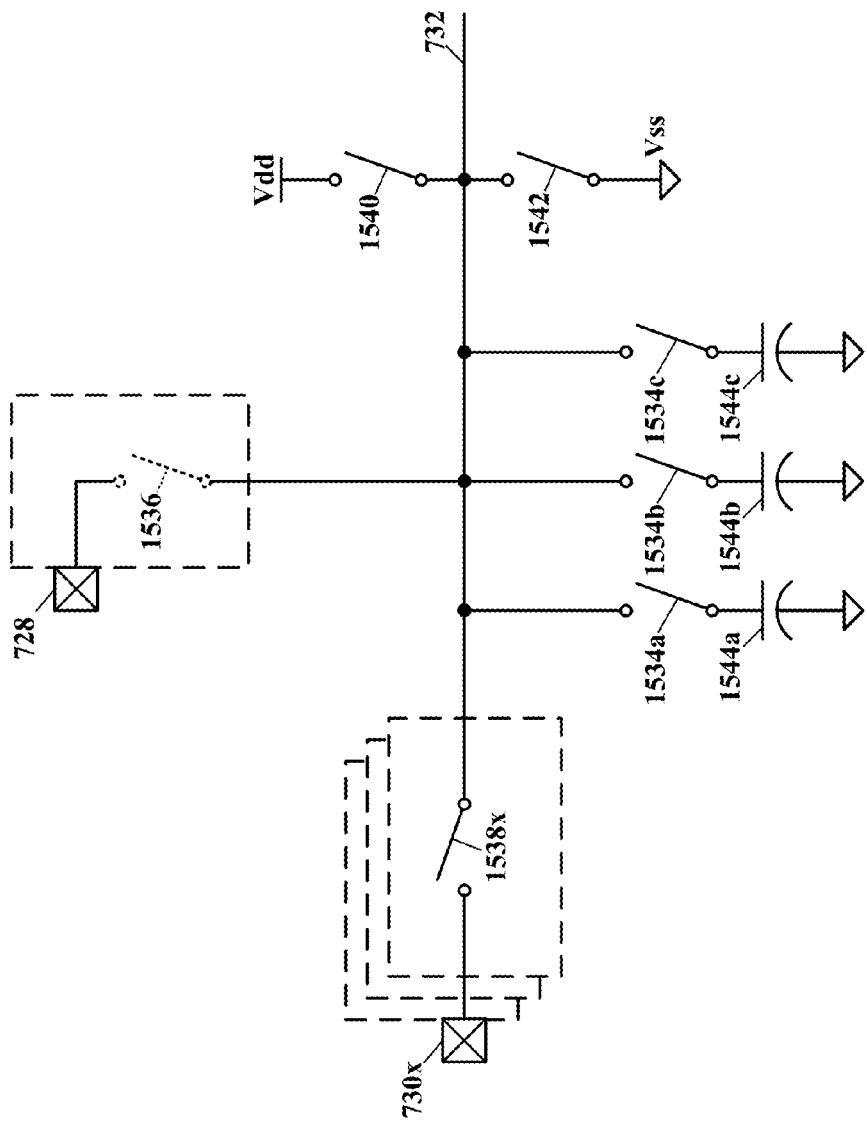
FIG. 15 illustrates a schematic block diagram of analog and digital connection configurations, according to specific example embodiments of this disclosure.

Port logic for node 728 may be implemented as shown in FIG. 13 or FIG. 14 as explained above. Port logic for nodes 724 and 726 may also be implemented as shown in FIG. 14 or 15, for example, without the "analog in" pass gate switch 1350. The plurality of Nodes 730 can be implemented as shown in FIG. 14. As mentioned above, a universal port may be used for all external pins. Additional functions can be implemented to support other functionalities according to a respective external pin.

Referring to FIG. 15, depicted is a schematic block diagram of analog and digital connection configurations, according to specific example embodiments of this disclosure. A plurality of analog pass gate switches 1538 may implement an analog multiplexer and couple and decouple a plurality of nodes 730x to and from an analog bus 732, e.g., selection of each of a plurality of capacitive touch sensors. Either a direct connection couples together the node 728 and the analog bus 732 (e.g., see FIG. 7), or an optional analog pass gate switch 1536 may couple and decouple the node 728 to and from the analog bus 732 (e.g., see FIG. 7A). As explained above, the additional pass gate switch 1536 can be part of the analog multiplexer if the multiplexer is designed to allow more than one switch to be closed. A plurality of switches 1534 may couple and decouple additional sample and hold capacitors 1544 to and from the analog bus 732. Switch 1540 may be used to charge the analog bus 732 to Vdd, and switch 1542 may be used to discharge the analog bus 732 to Vss.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A microcontroller comprising:
   a digital processor with memory;
   a plurality of external input/output nodes that can be programmed to function as analog nodes,
   a multiplexer controlled by the digital processor for selecting one of said analog nodes and coupling the analog node to an analog bus;
   an analog-to-digital converter (ADC) coupled with the analog bus for converting an analog voltage on the analog bus to a digital representation thereof and having a digital output coupled to the digital processor for conveying the digital representation; and an external node operable to be coupled to the analog bus in addition to one of the selected external input/output nodes.

2. The microcontroller according to claim 1, further comprising a switch between the external node and the analog bus, wherein the switch is programmably controlled by the digital processor.

3. The microcontroller according to claim 1, further comprising at least two digital output nodes of the microcontroller coupled to respective ones of a plurality of digital output drivers.

4. A microcontroller comprising:
a digital processor with memory;
a plurality of digital output drivers controlled by the digital processor;
a sample and hold capacitor;
an analog-to-digital converter (ADC) having a digital output coupled to the digital processor;
at least two digital output nodes of the microcontroller coupled to respective ones of the plurality of digital output drivers;
a first analog node coupled to a first analog bus in the microcontroller;
the first analog bus is switchably coupled to a power supply common, a power supply voltage, the sample and hold capacitor, or a second analog bus;
the second analog bus is switchably coupled to the power supply common, the power supply voltage, the sample and hold capacitor, or the first analog bus; and
the sample and hold capacitor is switchably coupled to either the first analog bus or an input of the ADC.

5. The microcontroller according to claim 4, wherein the first analog node is coupled to the second analog bus and is adapted for coupling to a capacitive sensor.

6. The microcontroller according to claim 4, wherein the at least two digital output nodes are adapted for coupling to a resistor voltage divider network that drives a voltage onto a guard ring associated with the capacitive sensor.

7. The microcontroller according to claim 4, further comprising a second analog node coupled to the second analog bus and adapted for coupling to an external capacitor.

8. The microcontroller according to claim 7, further comprising at least one internal capacitor switchably coupled to the second analog bus.

9. The microcontroller according to claim 4, further comprising a plurality of switches, wherein:
a first one of the plurality of switches couples the first and second analog buses together when closed,
a second one of the plurality of switches couples the first analog bus to a power supply common when closed,
a third one of the plurality of switches couples the second analog bus to a power supply voltage when closed,
a fourth one of the plurality of switches couples the first analog bus to the power supply voltage when closed, and
a fifth one of the plurality of switches couples the second analog bus to the power supply common when closed.

10. The microcontroller according to claim 9, wherein the digital processor controls the plurality of switches.

11. The microcontroller according to claim 9, wherein the plurality of switches are a plurality of field effect transistor (FET) switches.

12. The microcontroller according to claim 4, wherein the plurality of digital output drivers have logic high outputs at substantially the power supply voltage, and logic low outputs at substantially the power supply common.

13. A capacitive sensor system, said system comprising:
a capacitive sensor;
a guard ring associated with the capacitive sensor;
a first resistor coupled to the guard ring;
a second resistor coupled to the guard ring; and
a microcontroller, comprising:
a digital processor with memory;
a plurality of digital output drivers controlled by the digital processor;
a sample and hold capacitor;
an analog-to-digital converter (ADC) having a digital output coupled to the digital processor;
at least two digital output nodes of the microcontroller coupled to respective ones of the plurality of digital output drivers, wherein one of the at least two digital output nodes is coupled to the first resistor and the other one of the at least two digital output nodes is coupled to the second resistor;
a first analog node is coupled to a first analog bus in the microcontroller and the capacitive sensor;
the first analog bus is switchably coupled to a power supply common, a power supply voltage, the sample and hold capacitor, or a second analog bus;
the second analog bus is switchably coupled to the power supply common, the power supply voltage, the sample and hold capacitor, or the first analog bus; and
the sample and hold capacitor is switchably coupled to either the first analog bus or an input of the ADC.

14. The microcontroller according to claim 13, further comprising a second analog node coupled to the second analog bus and adapted for coupling to an external capacitor.

15. The capacitive sensor system according to claim 14, wherein the first resistor is twice the resistance of the second resistor.

16. The capacitive sensor system according to claim 15, wherein a combined capacitive value of the external capacitor and the sample and hold capacitor are approximately one-half the capacitive value of the capacitive sensor.

17. The microcontroller according to claim 13, further comprising at least one internal capacitor switchably coupled to the second analog bus.

18. The capacitive sensor system according to claim 13, further comprising a plurality of switches, wherein:
a first one of the plurality of switches couples the first and second analog buses together when closed,
a second one of the plurality of switches couples the first analog bus to a power supply common when closed,
a third one of the plurality of switches couples the second analog bus to a power supply voltage when closed,
a fourth one of the plurality of switches couples the first analog bus to the power supply voltage when closed, and
a fifth one of the plurality of switches couples the second analog bus to the power supply common when closed.

19. The capacitive sensor system according to claim 13, wherein a voltage on the guard ring is substantially the same as a voltage on the capacitive sensor.

20. The capacitive sensor system according to claim 13, wherein the digital processor controls the plurality of switches.

21. A method for measuring capacitance of a capacitive sensor and controlling a voltage on a guard ring associated with the capacitive sensor, said method comprising the steps of:
providing a capacitive sensor;

providing a guard ring associated with the capacitive sensor;
providing a first resistor coupled to the guard ring;
providing a second resistor coupled to the guard ring; and
providing a microcontroller, comprising:
a digital processor with memory;
a plurality of digital output drivers controlled by the digital processor;
a sample and hold capacitor;
an analog-to-digital converter (ADC) having a digital output coupled to the digital processor;
at least two digital output nodes of the microcontroller coupled to respective ones of the plurality of digital output drivers, wherein one of the at least two digital output nodes is coupled to the first resistor and the other one of the at least two digital output nodes is coupled to the second resistor;
a first analog node is coupled to a first analog bus in the microcontroller and the capacitive sensor;
the first analog bus is switchably coupled to a power supply common, a power supply voltage, the sample and hold capacitor, or a second analog bus;
the second analog bus is switchably coupled to the power supply common, the power supply voltage, the sample and hold capacitor, or the first analog bus; and
the sample and hold capacitor is switchably coupled to either the first analog bus or an input of the ADC; and
performing the steps of:
coupling the sample and hold capacitor to the first analog bus;
coupling the first analog bus to a power supply voltage;
coupling the second analog bus to a power supply common;
driving respective ones of the at least two digital output nodes to substantially the power supply common with outputs from the first and second output drivers;
driving a one of the at least two digital output nodes to substantially the power supply voltage;
driving an other one of the at least two digital output nodes to substantially the power supply common;
coupling the first and second analog buses together long enough for a first charge to settle therebetween;
decoupling the sample and hold capacitor from the first analog bus;
coupling the second analog bus to the power supply common;
coupling the second analog bus to the power supply voltage;
driving the third and fourth analog buses to substantially the power supply voltage;
converting the settled first charge on the sample and hold capacitor to a first digital representation thereof with the ADC;
reading the first digital representation from the ADC with the digital processor;
coupling the first analog bus to the power supply common;
driving the one of the at least two digital output nodes to substantially the power supply common;
driving the other one of the at least two digital output nodes to substantially the power supply voltage;
coupling the first and second analog buses together long enough for a second charge to settle therebetween;
decoupling the sample and hold capacitor from the first analog bus;
coupling the second analog bus to the power supply voltage;

coupling the second analog bus to the power supply common;
driving the third and fourth analog buses to substantially the power supply common;
converting the settled second charge on the sample and hold capacitor to a second digital representation thereof with the ADC; and
reading the second digital representation from the ADC with the digital processor.

22. The method according to claim 21, further comprising the step of processing the first and the second digital representations with the digital processor to substantially reduce common mode noise.

23. The method according to claim 21, further comprising the steps of:
storing the first and the second digital representations in a memory associated with the digital processor;
comparing the stored first and second digital representations with subsequent first and second digital representations, wherein
if the stored first and second digital representations are substantially the same as the subsequent first and second digital representations then the capacitive sensor is not actuated, and
if the stored first and second digital representations are not substantially the same as the subsequent first and second digital representations then the capacitive sensor is actuated.

24. A method for measuring capacitance of a capacitive sensor and controlling a voltage on a guard ring associated with the capacitive sensor, said method comprising the steps of:
a) charging a sample and hold capacitor to a first voltage;
b) charging a capacitive sensor to a second voltage;
c) charging a guard ring associated with the capacitive sensor to the second voltage;
d) charging the guard ring to a third voltage;
e) coupling together the sample and hold capacitor and the capacitive sensor long enough for a first charge to settle therebetween;
f) decoupling the sample and hold capacitor from the capacitive sensor;
g) converting the settled first charge on the sample and hold capacitor to a first digital representation thereof with an analog-to-digital converter (ADC);
h) charging the capacitive sensor to the second voltage;
i) charging the capacitive sensor to the first voltage;
j) charging the guard ring to the first voltage;
k) reading the first digital representation of the first charge from the ADC with a digital processor;
l) charging the guard ring to a fourth voltage;
m) coupling together the sample and hold capacitor and the capacitive sensor long enough for a second charge to settle therebetween;
n) decoupling the sample and hold capacitor from the capacitive sensor;
o) converting the settled second charge on the sample and hold capacitor to a second digital representation thereof with the analog-to-digital converter (ADC);
p) charging the capacitive sensor to the first voltage;
q) charging the capacitive sensor to the second voltage;
r) charging the guard ring to the second voltage;
s) reading the second digital representation of the second charge from the ADC with the digital processor; and
t) returning to step d).

25. The method according to claim 24, wherein the first voltage is approximately a power supply voltage and the second voltage is approximately a power supply common.

26. The method according to claim 24, wherein the first voltage is approximately a power supply common and the second voltage is approximately a power supply voltage.

27. The method according to claim 24, wherein a voltage on the guard ring is substantially the same as a voltage on the capacitive sensor.

28. A method of operating a microcontroller comprising a digital processor with memory, a plurality of external input/output nodes operable to be programmed to function as analog nodes, a multiplexer controlled by the digital processor for selecting one of said analog nodes and coupling the analog node to an analog bus, an analog-to-digital converter (ADC) coupled with the analog bus for converting an analog voltage on the analog bus to a digital representation thereof and having a digital output coupled to the digital processor for conveying the digital representation; and an external node coupled to the analog bus; the method comprising the steps of:

determining the capacitance of a capacitive sensor coupled with one of the external input/output nodes;

selecting an external capacitor to meet a predefined ratio between a sensor capacitance and a combination of sample and hold capacitance and external capacitance and connecting the external capacitor with the external node;

performing capacitive measurements according to a capacitive voltage division (CVD) principle using the sensor capacitance and the sample and hold capacitance which is parallel connected with the external capacitor.

29. The method according to claim 28, further comprising determining a guard ring voltage and generating a guard ring voltage by means of first and second digital output drivers connected to series connected first and second resistors, respectively.

\* \* \* \* \*